United States Patent
Lien et al.

(10) Patent No.: US 10,861,537 B1
(45) Date of Patent: Dec. 8, 2020

(54) COUNTERMEASURES FOR FIRST READ ISSUE

(71) Applicant: SanDisk Technologies LLC, Addison, TX (US)

(72) Inventors: Yu-Chung Lien, San Jose, CA (US); Huai-Yuan Tseng, San Ramon, CA (US); Deepanshu Dutta, Fremont, CA (US); Abhijith Prakash, Milpitas, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/668,886

(22) Filed: Oct. 30, 2019

(51) Int. Cl.
| | |
|---|---|
| *G11C 11/56* | (2006.01) |
| *G11C 11/4074* | (2006.01) |
| *G11C 11/409* | (2006.01) |
| *G11C 11/408* | (2006.01) |

(52) U.S. Cl.
CPC ........ *G11C 11/5642* (2013.01); *G11C 11/409* (2013.01); *G11C 11/4074* (2013.01); *G11C 11/4085* (2013.01)

(58) Field of Classification Search
CPC ............ G11C 11/5642; G11C 11/4074; G11C 11/409; G11C 11/4085
USPC .................................................. 365/185.21
See application file for complete search history.

(56) References Cited

U.S. PATENT DOCUMENTS

| | | | | |
|---|---|---|---|---|
| 1,029,744 | A | * | 6/1912 | Desilets .................. G01C 9/28 33/451 |
| 7,920,422 | B2 | * | 4/2011 | Mokhlesi ............... G11C 16/16 365/185.03 |
| 8,203,888 | B2 | | 6/2012 | Fukuda et al. |
| 8,730,734 | B2 | * | 5/2014 | Nguyen ................. G11C 16/04 365/185.18 |
| 8,730,741 | B2 | | 5/2014 | Shibata et al. |
| 9,343,164 | B2 | * | 5/2016 | Tseng ................. G11C 16/3459 |
| 9,685,236 | B2 | | 6/2017 | Nagashima |
| 9,711,231 | B1 | | 7/2017 | Yip et al. |
| 9,715,937 | B1 | | 7/2017 | Pang et al. |
| 9,830,994 | B1 | | 11/2017 | Mitsuhira et al. |
| 9,911,500 | B2 | | 3/2018 | Pang et al. |
| 10,026,486 | B1 | | 7/2018 | Dutta et al. |
| 10,235,294 | B1 | | 3/2019 | Lu et al. |
| 10,262,743 | B2 | | 4/2019 | Alrod et al. |
| 2013/0003454 | A1 | | 1/2013 | Edahiro et al. |
| 2016/0019950 | A1 | | 1/2016 | Yoo et al. |

(Continued)

OTHER PUBLICATIONS

International Search Report & the Written Opinion of the International Searching Authority dated Jul. 17, 2020, International Application No. PCT/US2020/025567.

*Primary Examiner* — Fernando Hidalgo

(74) *Attorney, Agent, or Firm* — Vierra Magen Marcus LLP

(57) ABSTRACT

Techniques are provided for operating non-volatile storage. Peak current consumption may be reduced in connection with sensing non-volatile memory cells. Peak current consumption may be reduced when a first read condition is present. In one aspect, the value of a parameter of a voltage that is applied to a word line during a pre-read phase of a sense operation is controlled in order to reduce peak current consumption when the first read condition is present. Examples of the parameter include a ramp rate, a number of intermediate voltage levels, and a start time.

20 Claims, 22 Drawing Sheets

(56) References Cited

U.S. PATENT DOCUMENTS

| | | |
|---|---|---|
| 2016/0071601 A1 | 3/2016 | Shirakawa et al. |
| 2018/0254090 A1 | 9/2018 | Dutta et al. |
| 2019/0206453 A1 | 7/2019 | Sugahara et al. |
| 2019/0304549 A1* | 10/2019 | Yang .................. H01L 27/1157 |
| 2020/0202961 A1* | 6/2020 | Chen .................. G11C 11/5671 |

* cited by examiner

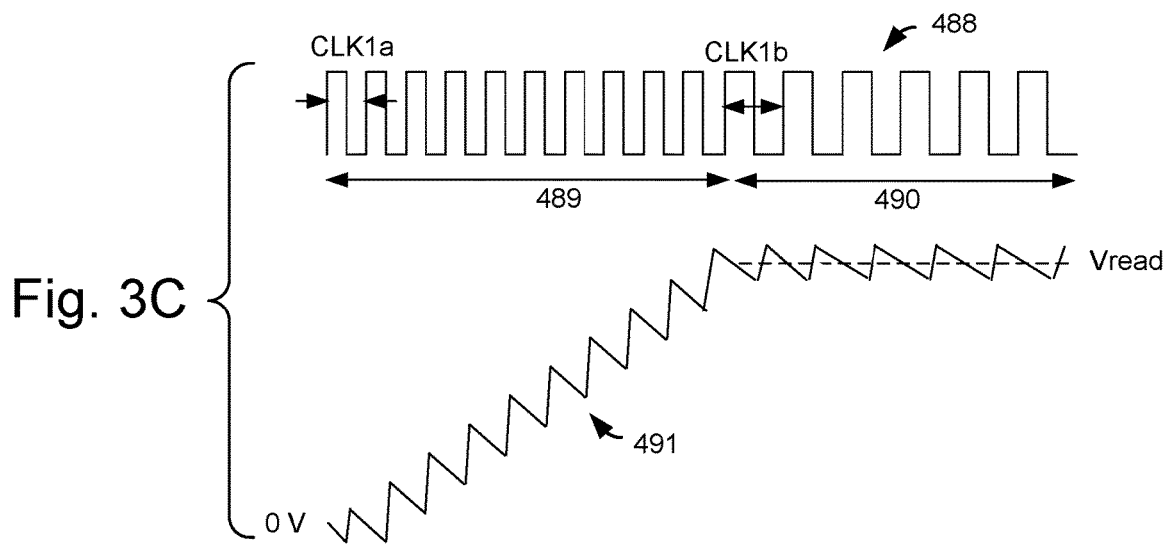
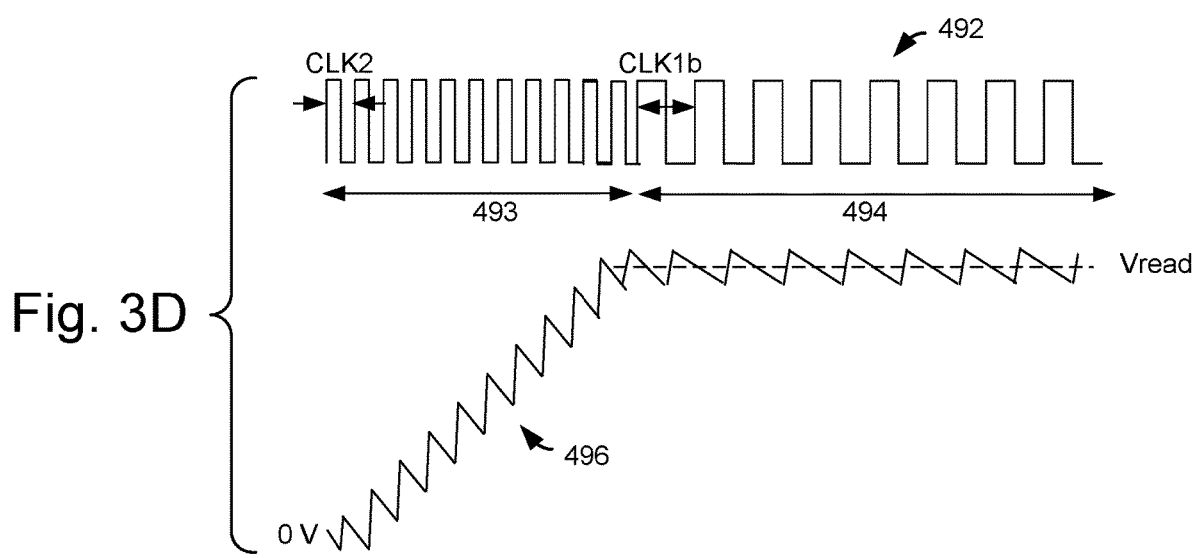

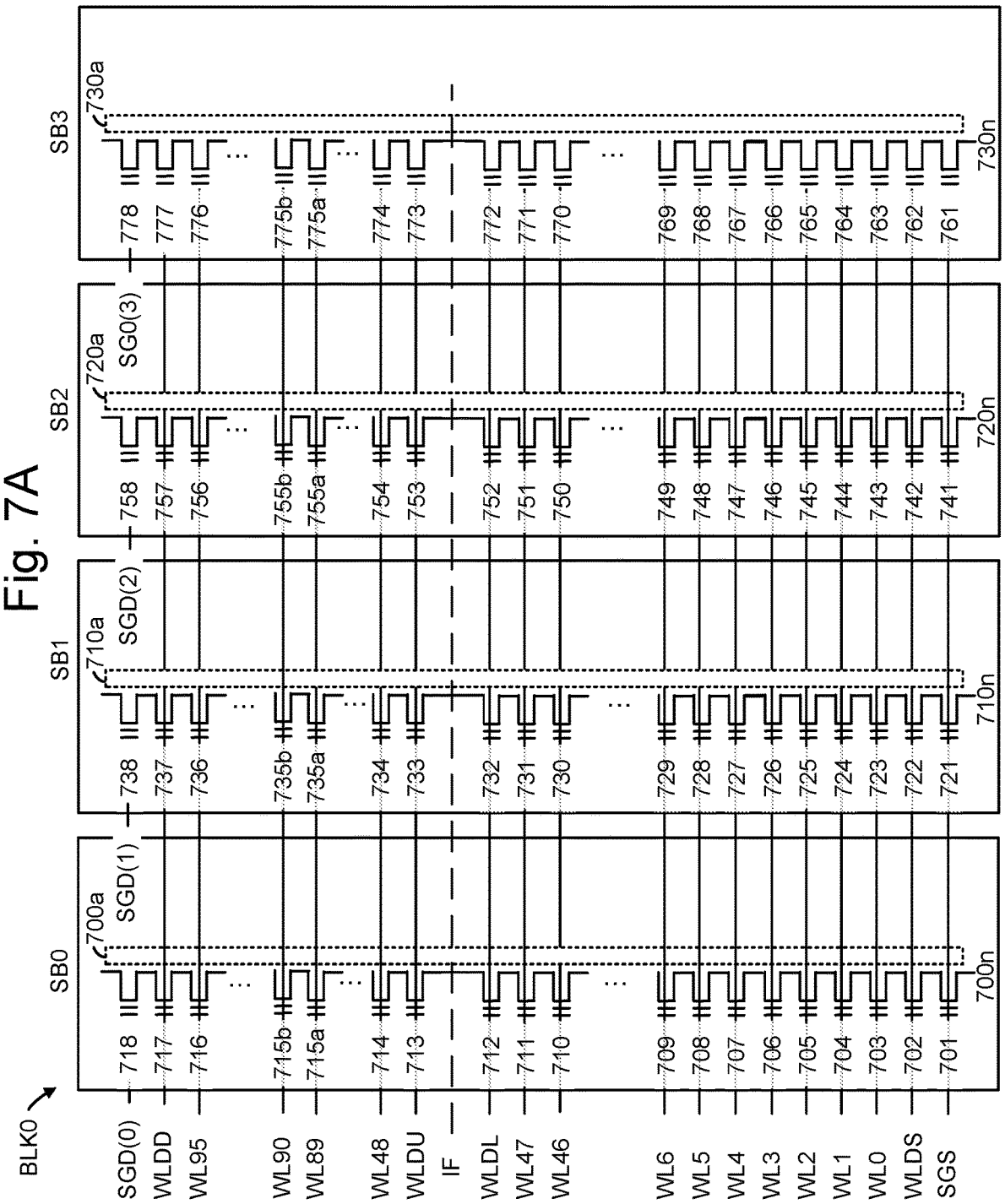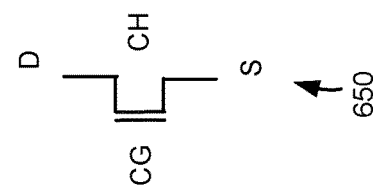

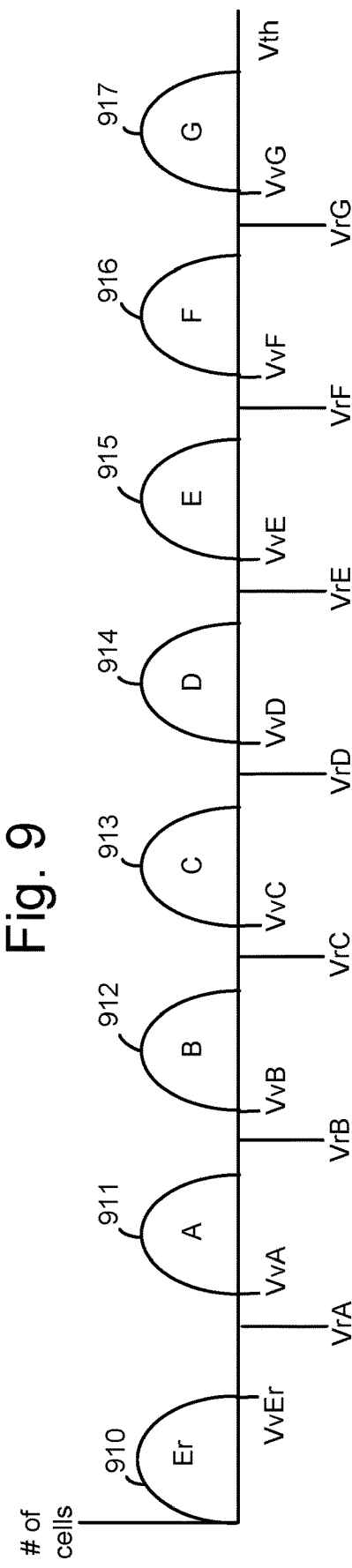

COUNTERMEASURES FOR FIRST READ ISSUE

BACKGROUND

The present technology relates to the operation of storage devices.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery).

BRIEF DESCRIPTION OF THE DRAWINGS

Like-numbered elements refer to common components in the different figures.

FIG. 3C depicts an example clock signal and output voltage of the charge pump of FIG. 3B where a slower ramp up rate is used.

FIG. 3D depicts an example clock signal and output voltage of the charge pump of FIG. 3B where a faster ramp up rate is used.

FIG. 7A depicts an example view of NAND strings in sub-blocks in a 3D configuration which is consistent with the two-tier stack of FIG. 5.

FIG. 7B depicts an example transistor which represents any of the memory cells or select gate transistors of FIG. 7A.

FIG. 9 depicts an example Vth distribution of a set of MLC memory cells in eight data states, with and without read disturb.

DETAILED DESCRIPTION

Figure 1:
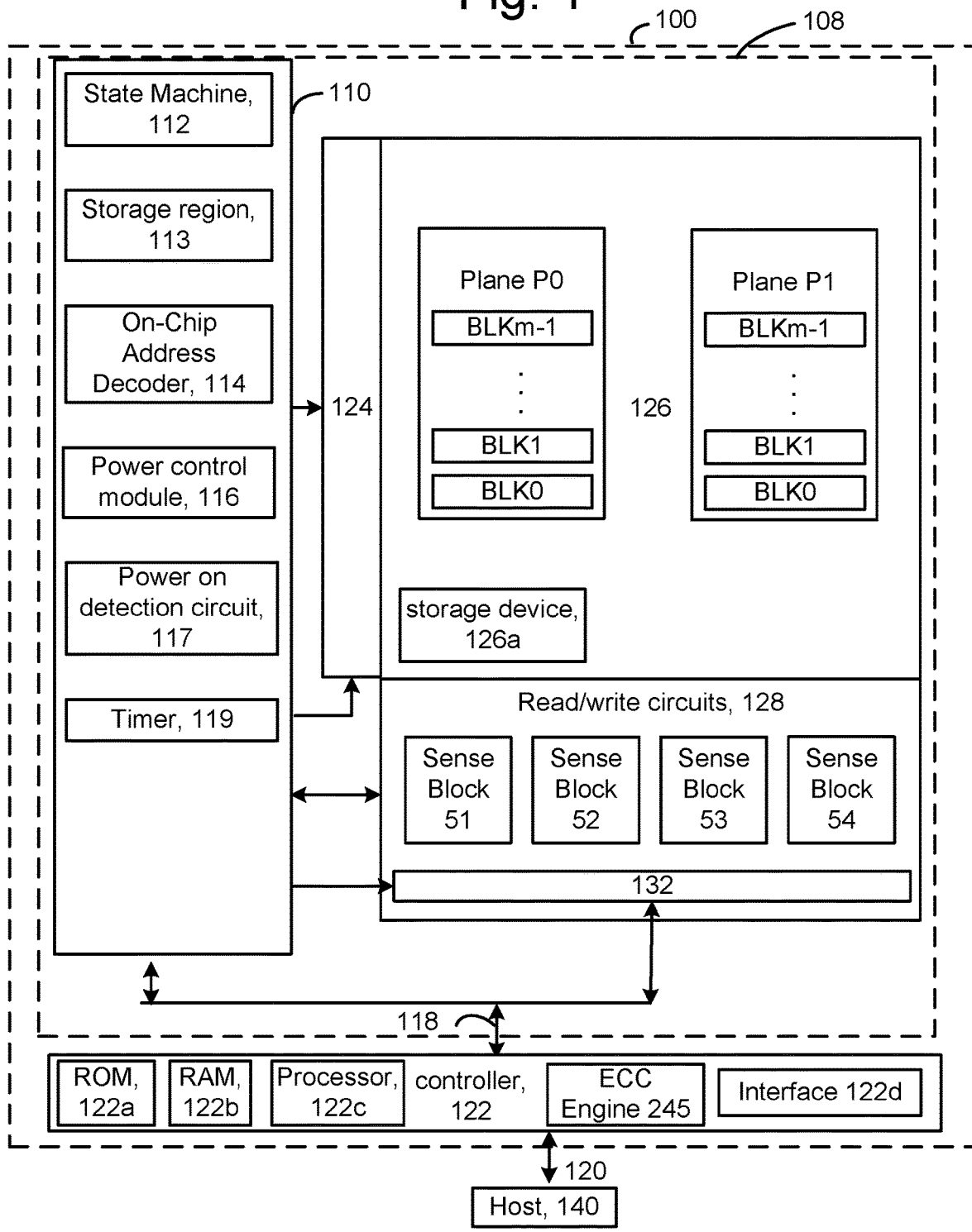
FIG. 1 is a functional block diagram of a storage device.

Techniques are provided for operating non-volatile storage. Peak current consumption may be reduced in connection with sensing non-volatile memory cells. Peak current consumption is an important parameter because if the peak current consumption is too high the power supply may be unable to provide adequate voltage for proper operation. Peak current consumption may be reduced when a first read condition is present. The first read condition will be discussed in more detail below. However, briefly, after a read or program verify, word line voltages may increase while the word line is floating. Over time, the word line voltage may decrease. The term first read applies when the word line voltages are not coupled up. The term second read applies when the word line voltages are coupled up just after a read or program verify. Since the word line voltages may fall over time, the first read and second read conditions may be defined based on a pre-determined threshold voltage.

The inventors have discovered that the peak current consumption may be significantly greater when the first read condition is present than when the second read condition is present. Stated another way, the inventors have discovered that the peak current consumption may be significantly greater just prior to the actual sensing of memory cells when the word line voltages are not coupled up relative to when the word line voltages are coupled up. Herein, the phrase "word line voltages are coupled up" or the like means that the floating word line voltage is greater than a pre-determined threshold voltage that is used to distinguish between a first read condition and a second read condition.

In some storage devices, memory cells are joined to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells.

The memory cells can include data memory cells, which are eligible to store user data, and dummy or non-data memory cells which are ineligible to store user data. A dummy memory cell may have the same construction as a data memory cell but is considered by the controller to be ineligible to store any type of data including user data. A dummy word line is connected to a dummy memory cell. One or more dummy memory cells may be provided at the drain and/or source ends of a string of memory cells to provide a gradual transition in the channel voltage gradient.

During a programming operation, the memory cells are programmed according to a word line programming order. For example, the programming may start at the word line at the source side of the block and proceed to the word line at the drain side of the block. In one approach, each word line is programmed before programming a next word line. For example, a first word line, WL0, is programmed, then a second word line, WL1, is programmed and so forth until the last word line in the block is programmed. A program operation may use a set of increasing program voltages which are applied to the word line in respective program loops or program-verify iterations.

Verify tests may be performed after each program voltage to determine whether the memory cells have completed programming. A verify test can involve applying a control gate voltage of an assigned data state to the selected word line while sensing circuitry determines whether cells connected to the word line are in a conductive or non-conductive state. As in a read operation, the voltages of the unselected word lines are set to a read pass voltage which is high enough to place the unselected memory cells in a strongly conductive state, to avoid interfering with the sensing of the selected memory cells. If a memory cell is in a non-conductive state, the Vth of the memory cell exceeds the control gate voltage and the memory cell has reached the assigned data state. Programming is thus completed for the memory cell, and it can be locked out from further programming while programming continues for other memory cells in subsequent program loops.

The memory cells may also be programmed according to a sub-block programming order, where memory cells connected to a word line are programmed in one sub-block, then a next sub-block and so forth.

Each memory cell may be associated with a data state according to write data in a program command. Based on its data state, a memory cell will either remain in the erased state or be programmed to a programmed data state. For example, in a single bit per cell storage device, also referred to as SLC, or single level cell, there are two data states including the erased state and the programmed state. MLC or multi-level cells store two or more bits per cell, as a multiple bit memory cell. For example, in a two-bit per cell storage device, there are four data states including the erased state and three higher data states referred to as the A, B and C data states. In a three-bit per cell storage device, there are eight data states including the erased state and seven higher data states referred to as the A-G data states (see FIG. 9). In a four-bit per cell storage device, there are sixteen data states including the erased state (S0) and fifteen higher data states (S1-S15).

After the memory cells are programmed, the data can be read back in a read operation. A read operation can involve applying a series of read voltages to a word line while sensing circuitry determines whether cells connected to the word line are in a conductive or non-conductive state. If a memory cell is in a non-conductive state, the Vth of the memory cell exceeds the read voltage. The read voltages are set at levels which are expected to be between the threshold voltage levels of adjacent data states. During the read operation, the voltages of the unselected word lines are set at a read pass voltage which is high enough to place the unselected memory cells in a strongly conductive state, to avoid interfering with the sensing of the selected memory cells. In one approach, a read operation occurs in a selected sub-block.

The memory cells can be in the first read condition after a power on event in the storage device. When the storage device is powered up for use, an operation may occur which checks for bad blocks. This operation involves applying 0 V or other low voltage to the word lines. As a result, any coupling up of the word line voltages is discharged.

The word lines can also be discharged in a block when the word line voltages are set to a low level. This can occur when the block is inactive while an operation is performed in another block. The cells can also be in the first read condition after a significant amount of time has passed after a last sensing operation in a block, since the word lines discharge over time.

The cells can be in the second read condition when the read occurs shortly, e.g., seconds or minutes, after a last sensing operation in a block. The cells gradually transition from the second read condition to the first read condition over time, e.g., one hour, as the word lines are discharged.

In some embodiments, a sense operation has a pre-read phase followed by a sense phase. The pre-read phase may be used to prepare the memory cells to be sensed, but the memory cells are not sensed until the sense phase. Note that the memory cells to be sensed are referred to herein as "selected memory cells" and a word line that is connected to the selected memory cells is referred to herein as the "selected word line." During the pre-read phase a voltage is applied to the selected word line. Voltages may also be applied to other word lines during the pre-read phase. In one embodiment, the pre-read phase is used to discharge channels of NAND strings prior to the sense phase. Embodiments disclosed herein reduce peak current during a pre-read phase when the first read condition is present.

FIG. 1 is a block diagram of an example storage device. The storage device 100, such as a non-volatile storage system, may include one or more memory die 108, also referred to as a chip or integrated circuit. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. In one embodiment, the memory structure comprise blocks of memory cells arranged in one or more planes. For example, blocks BLK0-BLKm-1 are arranged in each of planes P0 and P1. A plane may be an area of a substrate with a diffusion layer (such as the well region 433 in FIG. 3A) which is common to each block in the plane, in one approach. The blocks in a plane typically share a common set of bit lines.

The read/write circuits 128 include multiple sense blocks 51, 52, 53, 54 (sensing circuitry) and allow a page of memory cells to be read or programmed in parallel. Typically, a controller 122 is included in the same storage device 100 (e.g., a removable storage card) as the one or more memory die 108. The controller may be separate from the memory die. Commands and data are transferred between the host 140 and controller 122 via a data bus 120, and between the controller and the one or more memory die 108 via a path 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile storage device having circuitry associated with the operation of the memory cells, whether the associated circuitry is above or within the substrate.

The control circuitry 110 cooperates with the read/write circuits 128 to perform memory operations on the memory structure 126, and includes a state machine 112, a storage region 113, an on-chip address decoder 114, a power control module 116 (power control circuit), a power on detection circuit 117 and a timer 119. The state machine 112 provides chip-level control of memory operations. The storage region 113 may be provided for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. The sense blocks can include bit line drivers, in one approach. The power on detection circuit 117 may be used to detect when the storage device has been powered on. This circuit may comprise an event handler which may be a software or firmware routine, or a routine implemented in hardware. The timer 119 may be used to determine a time which has elapsed since a last sensing operation, such as a verify operation during programming or a read operation. The timer may increment based on a clock signal used in the storage device.

In some implementations, some of the components can be combined. In various designs, one or more of the components (alone or in combination), other than memory structure 126, can be thought of as at least one control circuit which is configured to perform the techniques described herein including the steps of the processes described herein. State machine 112 and/or controller 122 (or equivalently functioned circuits), in combination with all or a subset of the other circuits depicted in FIG. 1, can be considered a control circuit that performs the functions described herein. For example, a control circuit may include any one of, or a combination of, control circuitry 110, state machine 112, decoders 114 and 132, power control module 116, sense blocks 51-54, read/write circuits 128, controller 122, and so forth. The control circuit can include hardware only or a combination of hardware and software (including firmware). For example, a controller programmed by firmware to perform the functions described herein is one example of a control circuit. A control circuit can include a processor, PGA (Programmable Gate Array, FPGA (Field Programmable Gate Array), ASIC (Application Specific Integrated Circuit), integrated circuit or other type of circuit.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

The controller 122 or control circuitry 110 can be configured with hardware, firmware and/or software for implementing the processes described herein, including the processes of the flowcharts of FIGS. 11, 13, 15, 17, 19, and 20.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor storage devices include volatile storage devices, such as dynamic random access memory ("DRAM") or static random access memory ("SRAM") devices, non-volatile storage devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of storage device may have different configurations. For example, flash storage devices may be configured in a NAND or a NOR configuration.

The storage devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash storage device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash storage devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure. In a 2D memory structure, the semiconductor memory elements are arranged in a single plane or a single storage device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single storage device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple storage device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D storage device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) storage device level. Alternatively, the memory elements may be coupled together to form a vertical NAND string that traverses across multiple horizontal storage device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more storage device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each storage device level of the array are typically formed on the layers of the underlying storage device levels of the array. However, layers of adjacent storage device levels of a monolithic 3D memory array may be shared or have intervening layers between storage device levels.

2D arrays may be formed separately and then packaged together to form a non-monolithic storage device having multiple layers of memory. For example, non-monolithic stacked memories can be constructed by forming memory levels on separate substrates and then stacking the memory levels atop each other. The substrates may be thinned or removed from the storage device levels before stacking, but as the storage device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip storage device.

Associated circuitry is typically required for operation of the memory elements and for communication with the memory elements. As non-limiting examples, storage devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 126 include two-dimensional arrays, three-dimensional arrays, cross-point arrays, stacked two-dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A storage device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 2:
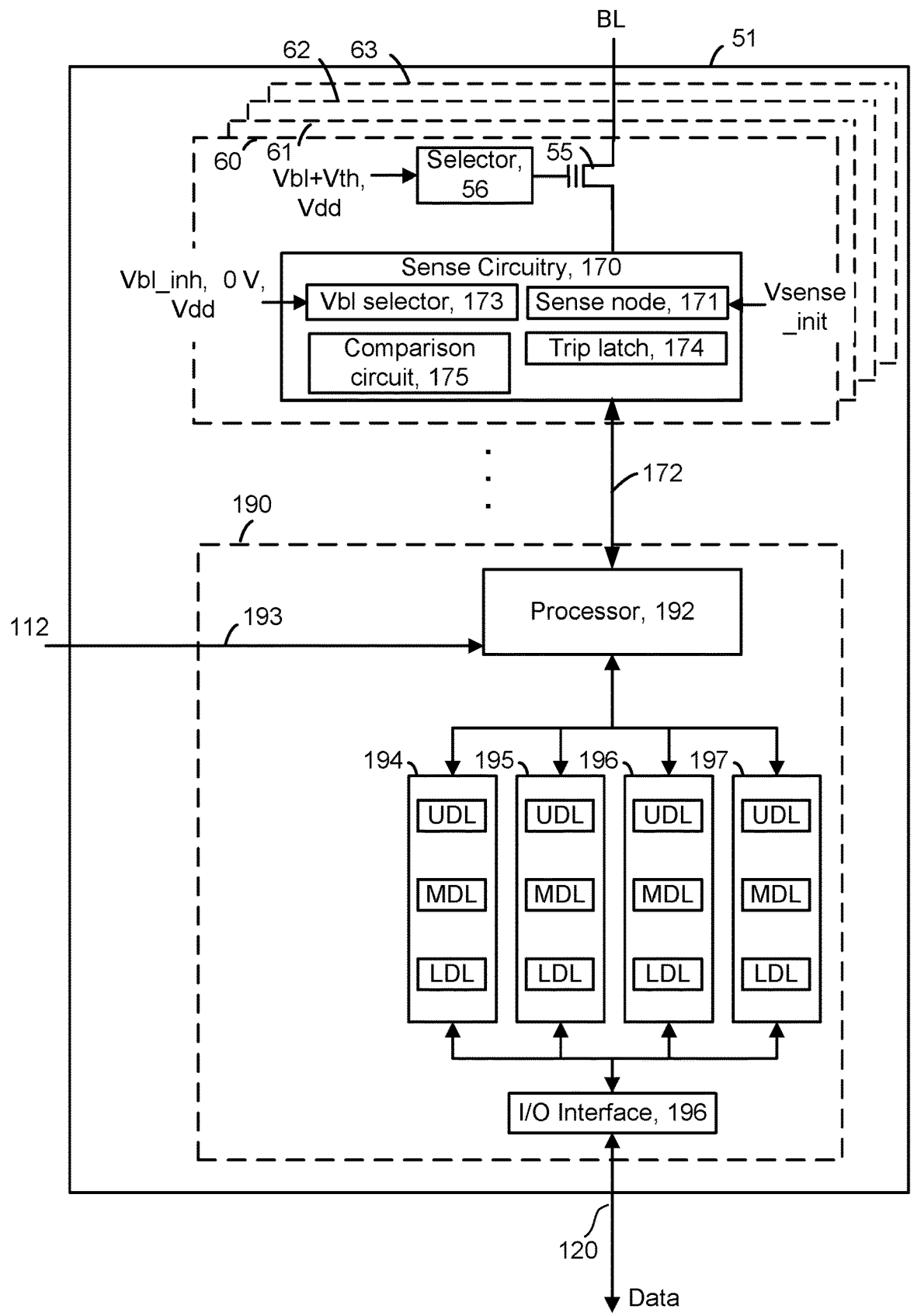
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense circuits 60, 61, 62, 63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vbl selector 173, a sense node 171, a comparison circuit 175 and a trip latch 174. During the application of a program voltage, the Vbl selector 173 can pass Vbl_inh (e.g., 2 V) to a bit line connected to a memory cell which is inhibited from programmed, or 0 V to a bit line connected to a memory cell which is being programmed in the current program loop. A transistor 55 (e.g., an nMOS) can be configured as a pass gate to pass Vbl from the Vbl selector 173, by setting the control gate voltage of the transistor sufficiently high, e.g., higher than the Vbl passed from the Vbl selector. For example, a selector 56 may pass a power supply voltage Vdd, e.g., 3-4 V to the control gate of the transistor 55.

During sensing operations such as read and verify operations, the bit line voltage is set by the transistor 55 based on the voltage passed by the selector 56. The bit line voltage is roughly equal to the control gate voltage of the transistor minus its Vth (e.g., 1 V). For example, if Vbl+Vth is passed by the selector 56, the bit line voltage will be Vbl. This assumes the source line is at 0 V. The transistor 55 clamps the bit line voltage according to the control gate voltage and acts a source-follower rather than a pass gate. The Vbl selector 173 may pass a relatively high voltage such as Vdd which is higher than the control gate voltage on the transistor 55 to provide the source-follower mode. During sensing, the transistor 55 thus charges up the bit line.

In one approach, the selector 56 of each sense circuit can be controlled separately from the selectors of other sense circuits, to pass Vbl or Vdd. The Vbl selector 173 of each sense circuit can also be controlled separately from the Vbl selectors of other sense circuits During sensing, the sense node 171 is charged up to an initial voltage such as Vsense_init=3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. If the sense node voltage decays below the trip voltage Vtrip, the memory cell is in a conductive state and its Vth is at or below the voltage of the verification signal. If the sense node voltage does not decay below Vtrip, the memory cell is in a non-conductive state and its Vth is above the voltage of the verification signal. The sense circuit 60 includes a trip latch 174 that is set by the comparison circuit 175 based on whether the memory cell is in a conductive or non-conductive state. The data in the trip latch can be a bit which is read out by the processor 192.

The managing circuit 190 comprises a processor 192, four example sets of data latches 194-197 and an I/O Interface 196 coupled between the set of data latches 194 and data bus 120. One set of data latches, e.g., comprising individual latches LDL, MDL and UDL, can be provided for each sense circuit. In some cases, additional data latches may be used. LDL stores a bit for a lower page of data, MDL stores a bit for a middle page of data, and UDL stores a bit for an upper page of data. This is in an eight-level or three-bits per memory cell storage device.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL, MDL and UDL latches, in a three-bit per memory cells implementation.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operation. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An MDL or UDL latch is flipped when a middle or upper page bit, respectively, is stored in an associated memory cell. This occurs when an associated memory cell completes programming.

Figure 3A:
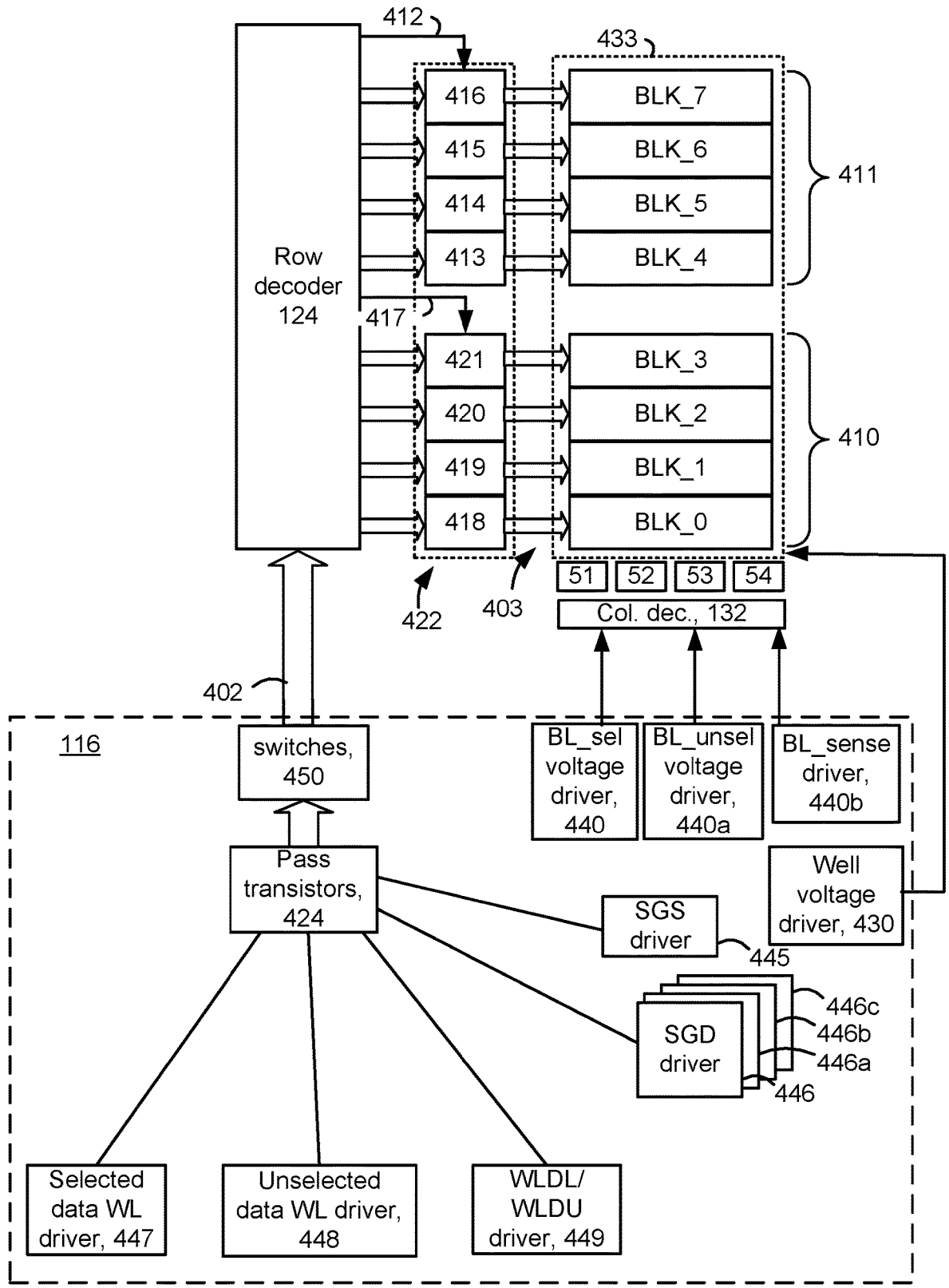
FIG. 3A depicts an example implementation of the power control module 116 of FIG. 1.

FIG. 3A depicts an example implementation of the power control module 116 of FIG. 1. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1 provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

The voltage drivers can include a selected data word line (WL) driver 447, which provides a voltage on a data word line selected during a program or read operation. The voltage drivers can also include one or more drivers 448 for unselected data word lines. These can be remaining, unselected word lines other than the selected word line. The voltage drivers can also include a WLDL/WLDU word line driver 449 which provides voltages on a lower dummy interface word line WLDL and an upper dummy interface word line WLDU. WLDU is adjacent to and above an interface of a multi-tier stack, and WLDL is adjacent to and below the interface. Both interface dummy word lines are driven together, in one approach. Separate drivers could also be provided for each interface dummy word line. Additional voltage drivers can be provided as needed based on the number of different voltage signals.

Figure 3B:
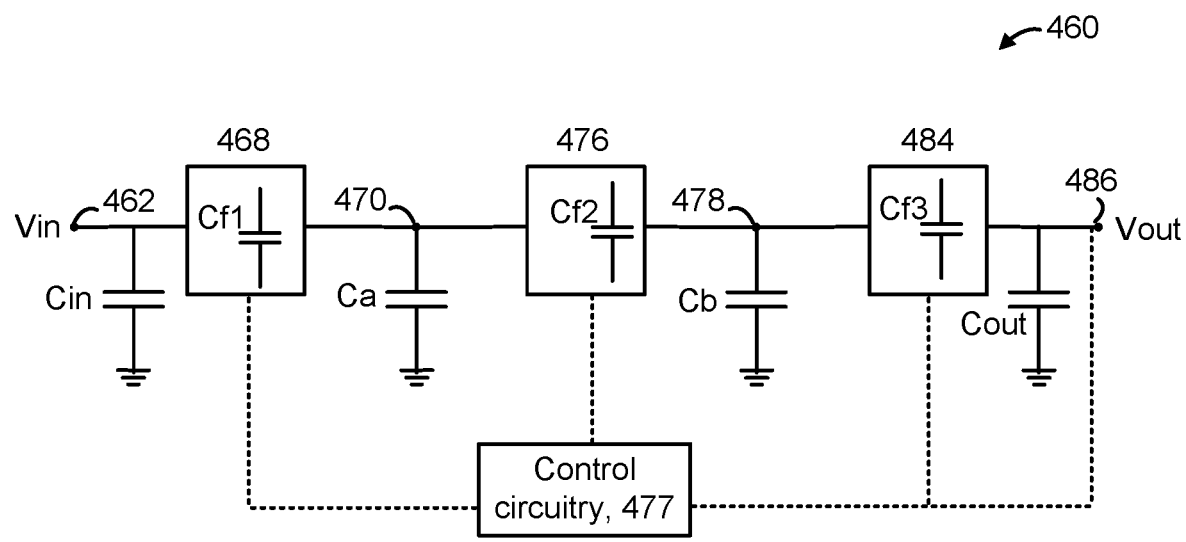
FIG. 3B depicts an example implementation of the drivers 447, 448, and 449 of FIG. 3A as a multi-stage charge pump.

In one embodiment, the word line drivers 447, 448, 449 can be operated such that the output voltage ramp rate is adjustable. In one embodiment, a different ramp rate is used for a first read condition than a second read condition, for at least one of the word line drivers. In one embodiment, a slower ramp rate is used for the first read condition than for the second read condition, for at least a portion of a read operation. In one embodiment, the slower ramp rate is used during a channel charging phase of a read operation when a first read condition is met. FIGS. 3B-3D provide further details of one embodiment of a charge pump that may be used within a word line driver to control the ramp rate.

The voltage drivers can also include separate SGD drivers for each sub-block in a block. For example, in BLK0 as depicted in FIG. 7A, SGD drivers 446, 446a, 446b and 446c can be provided for SGD(0)-SGD(3), respectively, in SB0-SB3, respectively. In one option, one SGS driver 445 is common to the different sub-blocks in a block. In another option, separate SGS drivers are provided for each sub-block of a block. Moreover, in some cases, there can be multiple SGD transistors, multiple SGS transistors, multiple drain side dummy memory cells and/or multiple source side dummy memory cells in each NAND string. To provide the greatest flexibility in programming these memory cells and transistors with program voltages or other word line specific parameters, there can be a separate driver for each select gate transistor and dummy memory cell in a NAND string, in one approach. Or, for simplicity, the multiple SGD transistors may be connected and commonly driven, the multiple SGS transistors may be connected and commonly driven, the multiple drain side dummy memory cells may be connected and commonly driven and the multiple source side dummy memory cells may be connected and commonly driven.

The various components, including the row decoder, may receive commands from a controller such as the state machine 112 or the controller 122 to perform the functions described herein.

In one approach, the well region 433 is common to the blocks and may be driven by a voltage driver 430. A set of bit lines is also shared by the blocks. During a program operation, a BL_sel bit line voltage driver 440 provides voltages to the selected bit lines and a BL_unsel bit line voltage driver 440a provides voltages to the unselected bit lines. During a sensing operation, a BL_sense bit line voltage driver 440b provides voltages to the bit lines.

In a stacked storage device such as depicted in FIGS. 4 to 8, sets of connected memory cells may be arranged in NAND strings which extend vertically upward from the substrate. The bottom (or source end) of each NAND string is in contact with the well region, and the top end (or drain end) of each NAND string is connected to a respective bit line, in one approach. The vertically extending NAND strings have a floating channel.

FIG. 3B depicts an example implementation of the drivers 447, 448 and 449 of FIG. 3A as a multi-stage charge pump 460. A charge pump is an example of a voltage driver which can provide a higher output voltage than its input voltage. Vin is provided at input node 462 and Vout is obtained at an output node 486. For example, Vin may be a fixed power supply voltage sometimes referred to as Vdd in a semiconductor chip. Vout could be a word line voltage, for instance.

As an example, three stages 468, 476 and 484 are provided. Each stage 468, 476 and 484 can include switches and one or more flying capacitors Cf1, Cf2 and Cf3, respectively, such as a MOS (metal oxide semiconductor) capacitor. At the node 462, charge from the input voltage is maintained in an input capacitor Cin which is connected to a ground node. At a node 470 which is between the first stage 468 and the second stage 476, a capacitor Ca is connected to a ground node. At a node 478 which is between the second stage 476 and the third stage 484, a capacitor Cb is connected to a ground node. Finally, at the output node 486, an output capacitor Cout is connected to a ground node. A multi-stage charge pump can provide greater flexibility in terms of providing a high output voltage and a greater range of output voltages, compared to a single stage charge pump. Further, each stage can include one or more capacitors to provide even greater flexibility.

The multi-stage charge pump 460 is operated by control circuitry 477 which controls switching in each stage. The switches may be MOSFETs, bipolar junction transistors or relay switches, for instance.

Based on the switching, charge is transferred from the input node 462 of the first stage to Cf1, and from Cf1 to the node 470. Charge is then transferred from the node 470 of the second stage to Cf2 in the second stage, and from Cf2 to the node 478. Charge is then transferred from the node 478 to Cf3 in the third stage, and from Cf3 to the output node 486.

Generally, each stage of the charge pump operation includes two main phases: charging the flying capacitor from the input node, and discharging the flying capacitor into the output node. During each phase, some switches are closed (conductive), connecting the flying capacitor to either the input node, the output node, or a ground node. The control circuitry 477 may communicate with the output node 486 as well such as to detect its level and to make adjustments in the charge pump. For example, a switching frequency can be reduced if Vout is above a target voltage, or increased if Vout is below the target voltage. As discussed further in connection with FIGS. 3C and 3D, Vout is proportional to the switching frequency.

Note that the circuits shown are examples only, as various modifications can be made. Other types of voltage driver circuits could be used as well.

FIGS. 3C and 3D depicts two example clock signals that are used to achieve different ramp rates for the charge pump of FIG. 3A. FIG. 3C depicts an example clock signal 488 and output voltage 491 of the charge pump of FIG. 3B where a slower ramp up rate is used. Slower here means slower relative to the example of FIG. 3D. The clock signal is provided by the control circuitry 477 to activate switches in the stages of the charge pump. The output voltage increases with each charge period, starting from 0 V and ending at Vread, for example, e.g., 8-10 V. This may be the peak level during the discharge of the channels in a read operation, for instance, as with Vread in FIG. 12D-12F. The output voltage has a ripple shape due to the repeated charging and discharging of the capacitors in the charge pump. The clock signal has period CLK1a in a time period 489 in which the output voltage increases. The clock signal then changes to have a period CLK1b>CLK1a in a time period 490 when the output voltage reaches Vread, and the output voltage subsequently remains at Vread. The output voltage can return to 0 V or other initial level at a designated time.

FIG. 3D depicts an example clock signal 492 and output voltage 496 of the charge pump of FIG. 3B where a faster ramp up rate is used. Faster here means faster relative to the example of FIG. 3C. The output voltage increases with each charge period, starting from 0 V and ending at Vread, for example. The clock signal has period CLK2<CLK1a in a time period 493 in which the output voltage increases. The clock signal then changes to have the period CLK1b>CLK2, as in FIG. 3C, in a time period 494 when the output voltage reaches Vread, and the output voltage subsequently remains at Vread.

Figure 4:
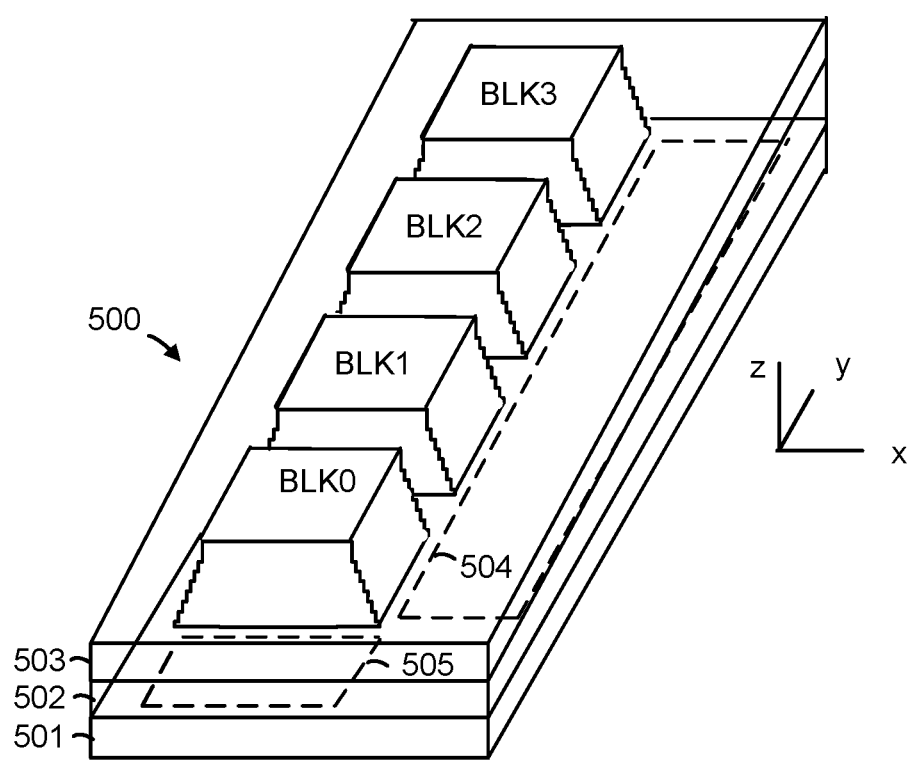
FIG. 4 is a perspective view of a storage device comprising a set of blocks in an example 3D configuration of the memory structure 126 of FIG. 1.

FIG. 4 is a perspective view of a storage device 500 comprising a set of blocks in an example 3D configuration of the memory structure 126 of FIG. 1. On the substrate 501 are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the storage device. In an upper region 503 of the storage device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the storage device. The blocks could also be arranged in multiple planes.

Figure 5:
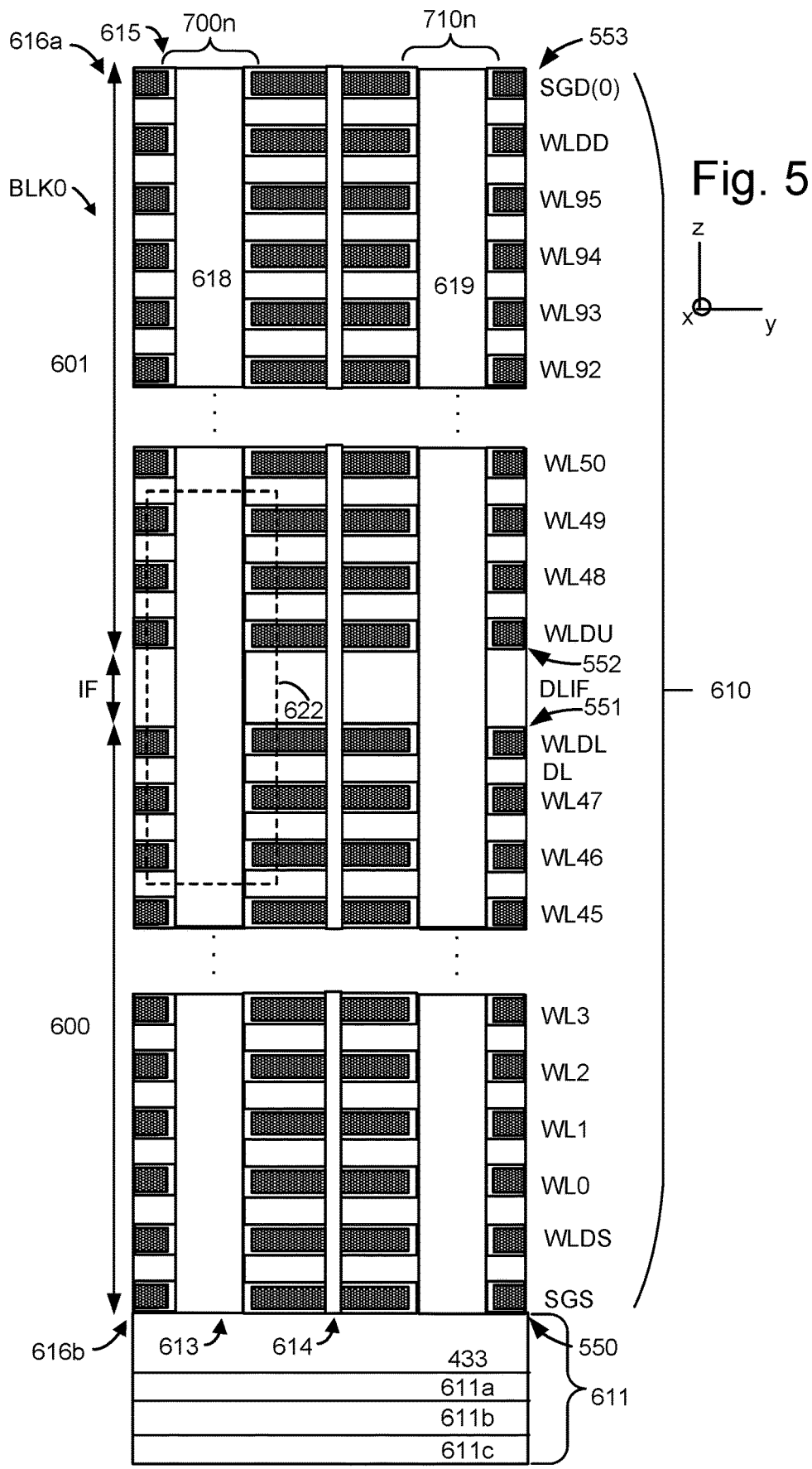
FIG. 5 depicts an example cross-sectional view of a portion of BLK0 of FIG. 4, including NAND strings 700n and 710n.

FIG. 5 depicts an example cross-sectional view of a portion of BLK0 of FIG. 4, including NAND strings 700n and 710n. The block comprises a stack 610 of alternating conductive and dielectric layers in two tiers including a lower tier 600 (e.g., a first tier or a bottom tier) and an upper tier 601 (e.g., a second tier or a top tier). The tiers are separated by an interface (IF) (or interface region or junction) which is formed of dielectric material. The conductive layers comprise SGS, WLDS, WL0-WL47, WLDL, WLDU, WL48-WL95, WLDD and SGD(0). WLDS, WLDL, WLDU and WLDD are dummy word lines or conductive layers connected to dummy memory cells which are ineligible to store user data, WL0-WL47 are data word lines or conductive layers in the lower tier connected to data memory cells which are eligible to store user data, and WL48-WL95 are data word lines in the upper tier. As an example only, the stack includes 96 data word lines, and the data word lines are evenly divided between the two tiers. DL is an example dielectric layer outside the interface, and DLIF is a dielectric layer of the interface.

A top 553 of the upper tier and the stack is depicted along with a bottom 552 of the upper tier, a top 551 of the lower tier and a bottom 550 of the lower tier and the stack.

WLDL and WLDU are examples of unselected word lines adjacent to the interface, and WL0-WL47 and WL48-WL95 are examples of unselected word lines non-adjacent to the interface in the lower and upper tiers, respectively.

The NAND strings each comprise a memory hole 618 or 619, respectively, which is filled with materials which form memory cells adjacent to the word lines. For example, see region 622 of the stack which is shown in greater detail in FIG. 6.

The stack is formed on a substrate 611. In one approach, a well region 433 (see also FIG. 3A) is an n-type source diffusion layer or well in the substrate. The well region is in contact with a source end of each string of memory cells in a block. The n-type well region 433 in turn is formed in a p-type well region 611a, which in turn is formed in an n-type well region 611b, which in turn is formed in a p-type semiconductor substrate 611c, in one possible implementation. The n-type source diffusion layer may be shared by all of the blocks in a plane, in one approach, and form a source line SL which provides a voltage to a source end of each NAND string.

The NAND string 700n has a source end 613 at a bottom 616b of the stack 610 and a drain end 615 at a top 616a of the stack. Metal-filled slits may be provided periodically across the stack as interconnects which extend through the stack, such as to connect the source line to a line above the stack. The slits may be used during the formation of the word lines and subsequently filled with metal. Vias may be connected at one end to the drain ends of the NAND strings and at another end to a bit line.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

An insulation-filled region 614 separates the block into sub-blocks, where the NAND strings 700n and 710n are in different sub-blocks.

Figure 6:
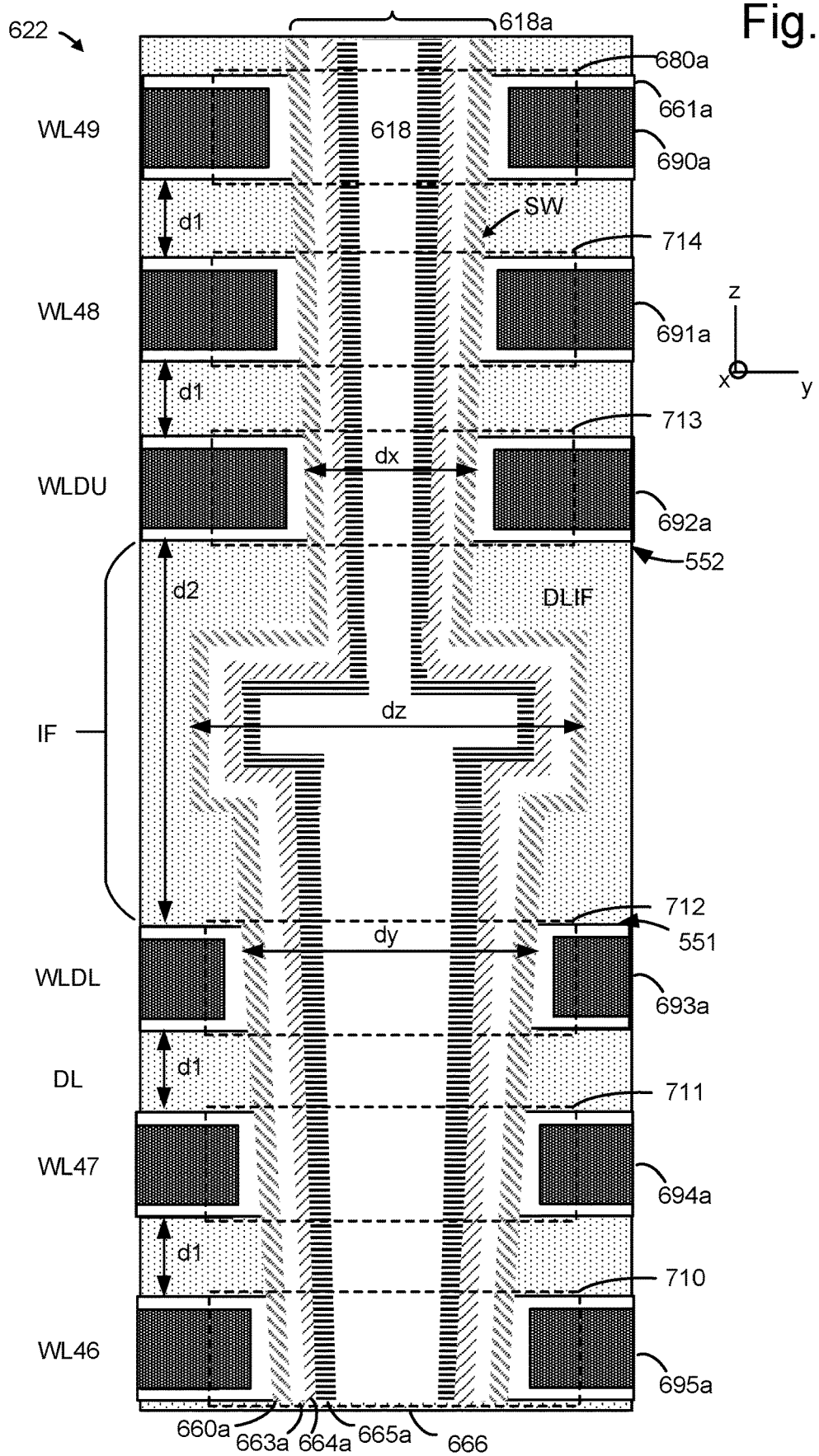
FIG. 6 depicts a close-up view of the region 622 of the stack of FIG. 5.

FIG. 6 depicts a close-up view of the region 622 of the stack of FIG. 5. The region includes the three word lines below the interface, WL46, WL47 and WLDL, and the three word lines above the interface, WLDU, WL48 and WL49. Generally, the NAND string comprises memory cells connected to respective word lines. This example includes memory cells 680a, 714, 713, 712, 711 and 710 connected to word lines WL49, WL48, WLDU, WLDL, WL47 and WL46, respectively. The word lines or word line layers are spaced apart by dielectric layers, which each have a thickness or height of d1 (a first distance) outside the interface, and by DLIF, which has a larger thickness or height of d2 (a second distance) in the interface. D1 and d2 are also inter-cell distances, or distances between adjacent memory cells along the z or vertical axis. In one approach, d2 is at least 1.5-4 times the height of d1. DLIF can be an aggregated layer which is made up of dielectric materials which are deposited in one or more separate layers on top of one another. The thickness or height of d2 of the interface is greater than a height of dielectric layers between the data memory cells.

The memory cell 713 is connected to WLDU, and is adjacent to and above the interface. The memory cell 712 is connected to WLDL, and is adjacent to and below the interface. These are interface memory cells. The second distance spans the interface. In some cases, the memory cells 713 and 712 can be set as dummy memory cells which are ineligible to store user data, due to the difficulty in controlling the channel region along the interface. WLDU and WLDL are dummy word lines in this case.

The memory hole which is etched through each tier of the stack has a tapered shape, e.g., wider at the top and narrower at the bottom. As a result, the memory hole diameter dy at the top word line layer or memory cell in the lower tier is larger than the memory hole diameter dx at the bottom word line layer or memory cell in the upper tier. A diameter dz represents a widest region of the memory hole. This widened region is used to accommodate small misalignments in the memory hole portion of the upper tier relative to the memory hole portion in the lower tier. The increased thickness d2 of DLIF is provided due to process margin concerns and also accommodates misalignment by providing a transition region between the memory hole portions in the two tiers.

The diameter of the memory hole thus changes abruptly partway along a height of the memory hole.

A number of layers or films can be deposited along the sidewall of the memory hole. The layers can conform to the changing diameter in the interface. For example, the layers can include a blocking oxide/block high-k material 660a, a charge-trapping layer 663a (e.g., silicon nitride ($Si_3N_4$) or other nitride), a tunneling layer 664a (e.g., oxide) and a channel 665a layer (e.g., polysilicon). A dielectric core 666 (e.g., silicon dioxide) fills a remainder of the memory hole. A pillar 618a or column can be formed by the materials within a memory hole as an active area of a NAND string. Referring to WL49 as an example, a word line layer can include a metal barrier 661a, and a conductive metal 662a as a control gate. For example, control gates 690a, 691a, 692a, 693a, 694a and 695a are provided. The NAND string can be considered to have a floating body channel because the length of the channel is not formed on a substrate. When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

In FIGS. 5 and 6, a NAND string 700n, 710n extends in a memory hole 618, 619, and the memory hole comprises a portion in the lower tier and a portion in the upper tier. Also, at the interface (IF), a width dy of the portion in the lower tier is greater than a width dx of the portion in the upper tier.

FIG. 7A depicts an example view of NAND strings in sub-blocks in a 3D configuration which is consistent with the two-tier stack of FIG. 5. Each sub-block includes multiple NAND strings or other sets of memory cells connected to one another, where one example NAND string is depicted for each sub-block. The memory cells in a set may be connected to one another serially. For example, SB0, SB1, SB2 and SB3 comprise example NAND strings 700n, 710n, 720n and 730n, respectively. In this example, each NAND string has one SGD transistor, one drain-side dummy memory cell, 96 data memory cells (where 48 are above the interface IF, i.e., connected to WL48-WL95, and 48 are below the interface, i.e., connected to WL0-WL47), one source-side dummy memory cell and one SGS transistor.

In the block BLK0, each sub-block comprises a set of NAND strings which extend in the x direction and which have a common SGD line. The NAND strings 700n, 710n, 720n and 730n are in sub-blocks SB0, SB1, SB2 and SB3, respectively. Programming of the block may occur one sub-block at a time. Within each sub-block, a word line programming order may be followed, e.g., starting at WL0, the source end word line and proceeding one word line at a time to WL95, the drain end data word line.

The NAND strings 700n, 710n, 720n and 730n have channels 700a, 710a, 720a and 730a, respectively. Each channel can extend continuously from a source end select gate transistor to a drain end select gate transistor. For example, the channel 700a extends continuously in the NAND strings 700n from the SGS transistor 701 to the SGD transistor 718. The channel 700a is continuous in that it is uninterrupted and can therefore provide a continuous conductive path in the NAND string.

NAND string 700n includes SGS transistor 701, source-side dummy memory cell 702 connected to WLDS, lower tier data memory cells 703-711 connected to WL0-WL47, interface-adjacent dummy memory cells 712 and 713 connected to WLDL and WLDU, respectively, upper tier data memory cells 714, 715a, 715b, 716 connected to WL48-WL95, drain-side dummy memory cell 717 connected to WLDD, and SGD transistor 718 connected to SGD(0).

Similarly, NAND string 710n includes SGS transistor 721, source-side dummy memory cell 722 connected to WLDS, lower tier data memory cells 723-731 connected to WL0-WL47, interface-adjacent dummy memory cells 732 and 733 connected to WLDL and WLDU, respectively, upper tier data memory cells 734, 735a, 735b, 736 connected to WL48-WL95, drain-side dummy memory cell 737 connected to WLDD, and SGD transistor 738 connected to SGD(1).

NAND string 720n includes SGS transistor 741, source-side dummy memory cell 742 connected to WLDS, lower tier data memory cells 743-751 connected to WL0-WL47, interface-adjacent dummy memory cells 752 and 753 connected to WLDL and WLDU, respectively, upper tier data memory cells 754, 755a, 755b, 756 connected to WL48-WL95, drain-side dummy memory cell 757 connected to WLDD, and SGD transistor 758 connected to SGD(2).

NAND string 730n includes SGS transistor 761, source-side dummy memory cell 762 connected to WLDS, lower tier data memory cells 763-771 connected to WL0-WL47, interface-adjacent dummy memory cells 772 and 773 connected to WLDL and WLDU, respectively, upper tier data memory cells 774, 775a, 775b, 776 connected to WL48-WL95, drain-side dummy memory cell 777 connected to WLDD, and SGD transistor 778 connected to SGD(3).

In this example, the dummy memory cells 713, 733, 753 and 773 are adjacent to and above the interface, and the dummy memory cells 712, 732, 752 and 772 are adjacent to and below the interface.

A selected sub-block is a sub-block which contains the selected memory cells being read. As mentioned, for a given word line, the memory cells in one sub-block can be read in a read operation. An unselected sub-block is a sub-block which does not contains the selected memory cells being read. For example, in FIG. 7A, if SB0 is the selected sub-block, then SB1-SB3 are unselected sub-blocks. If WLn=WL_sel=WL5, memory cell 708 and other memory cells connected to WL5 in SB0 are selected memory cells. Memory cells 728, 748 and 768 and other memory cells connected to WL5 in SB1, SB2 and SB3, respectively, are examples of unselected memory cells. Also in this example, memory cells 709, 729, 749 and 769 and other memory cells connected to WLn+1=WL6 in SB0, SB1, SB2 and SB3, respectively, are examples of unselected memory cells, and memory cells 707, 727, 747 and 767 and other memory cells connected to WLn−1=WL4 in SB0, SB1, SB2 and SB3, respectively, are examples of unselected memory cells.

FIG. 7B depicts an example transistor 650 which represents any of the memory cells or select gate transistors of FIG. 7A. The transistor comprises a control gate CG, a drain D, a source S and a channel CH and may represent a memory cell or a select gate transistor, for example.

Figure 8:
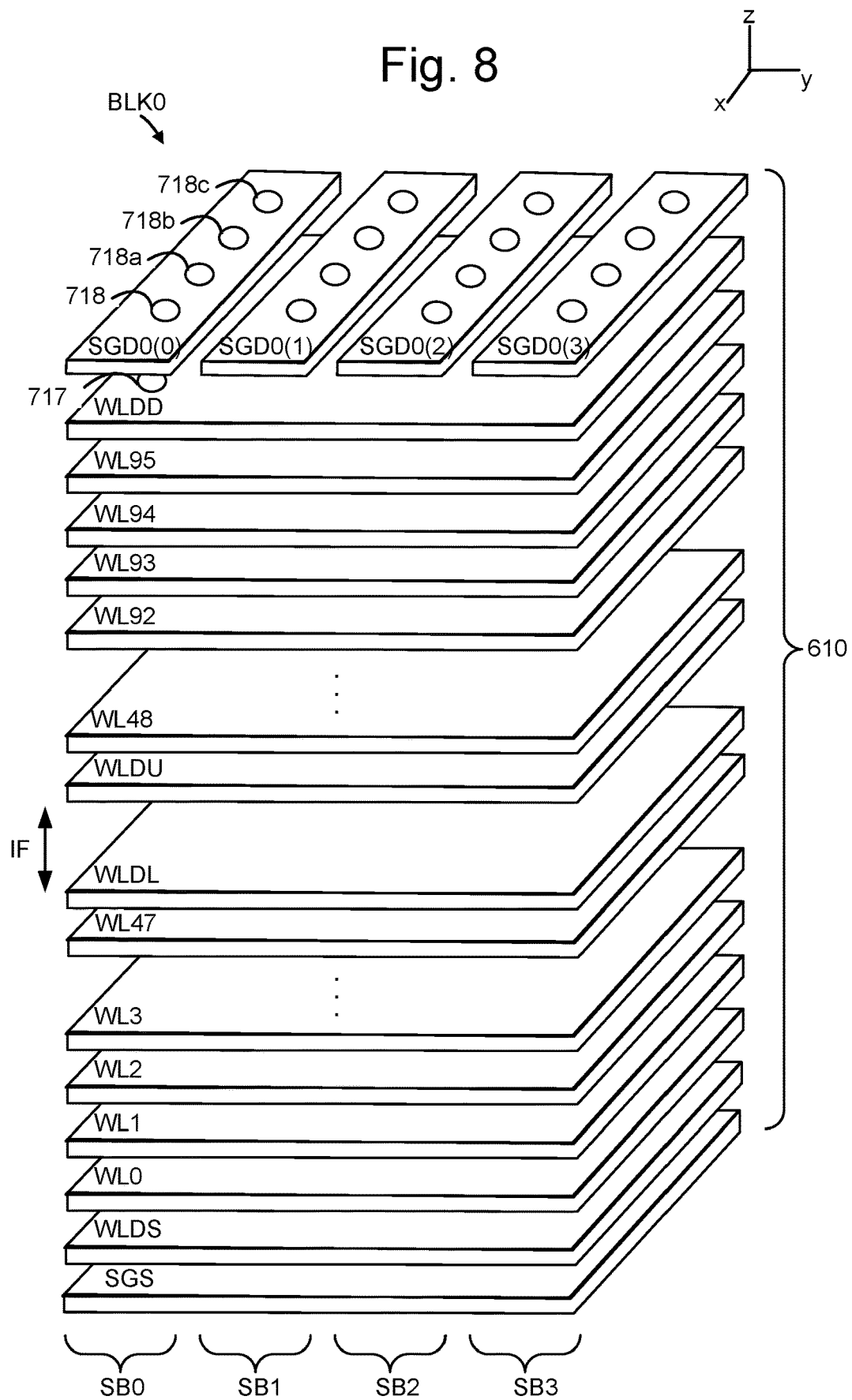
FIG. 8 depicts control gate layers in BLK0 consistent with FIG. 5-7A.

FIG. 8 depicts control gate layers in BLK0 consistent with FIG. 5-7A. The control gate layers are arranged in the stack 610 and include the layers SGS, WLDS, WL0-WL47, WLDL, WLDU, WL48-WL95, WLDD and SGD(0)-SGD (3). The SGS control gate layer is common for the block. Optionally, a separate SGS control gate layer could be provided for each sub-block. Additionally, four example memory holes are depicted in each sub-block. As mentioned, select gate transistors and memory cells can be formed along each memory hole in a NAND string. For example, SGD transistors 718, 718a, 718b and 718c are depicted in SGD0 (0), and a dummy memory cell 717 is depicted in WLDD.

FIG. 9 depicts an example Vth distribution of a set of MLC memory cells in eight data states. The memory cells are connected to a selected word line. Verify voltages VvA, VvB, VvC, VvD, VvE, VvF and VvG are associated with the A, B, C, D, E, F and G data states, respectively. The program operation is completed when the Vth of the programmed memory cells exceeds the respective verify voltage of the assigned data state.

At a start of a program operation, the memory cells are all initially in the erased state as represented by the Vth distribution 910. After the program operation is successfully completed, the memory cells assigned to the Er state are represented by the Vth distribution 910.

The memory cells which are programmed to the A, B, C, D, E, F and G states are represented by the Vth distributions 911, 912, 913, 914, 915, 916 and 917, respectively, immediately after programming is completed, and before read disturb. The verify voltages are used in the verify operations or tests of the memory cells. These verify voltages are also referred to as final verify voltages.

Read voltages VrA, VrB, VrC, VrD, VrE, VrF and VrG can be used for reading the states of the memory cells in a read operation.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase verify voltage, VvEr, which is applied.

Figure 10A:
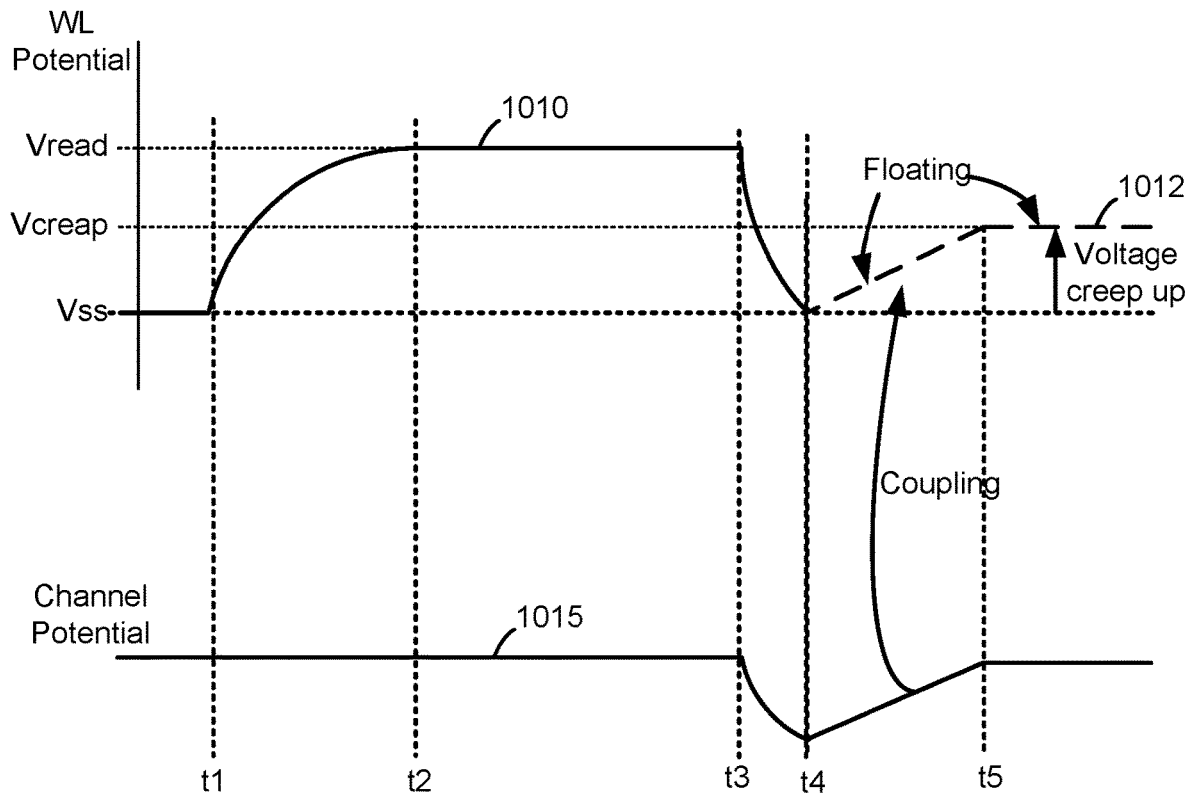
FIGS. 10A and 10B depict word line voltages during a sensing operation (e.g., read or verify) for different conditions.
Figure 10B:
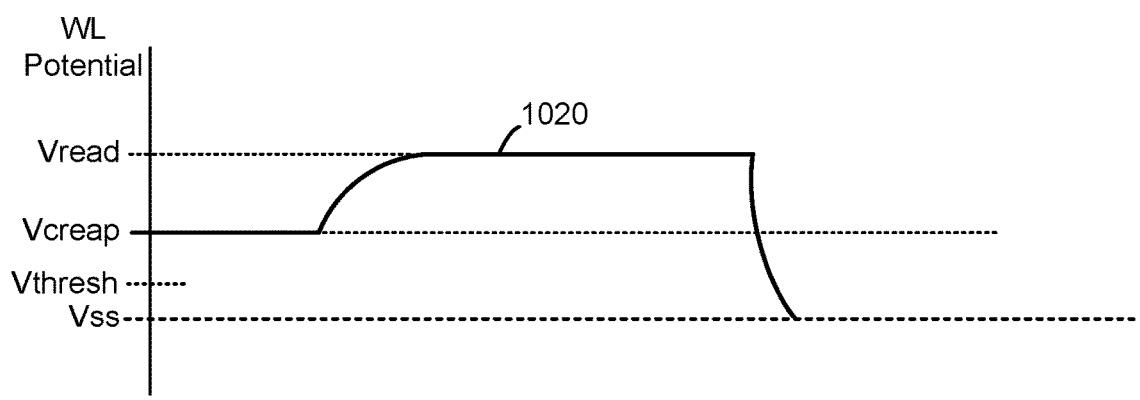

FIGS. 10A and 10B depict word line voltages during a sensing operation (e.g., read or program verify) for different conditions. The condition in FIG. 10A is referred to herein as a "first read" condition. The condition in FIG. 10B is referred to herein as a "second read" condition.

FIG. 10A depicts a timing diagram of a voltage applied to a word line during a sensing operation, as well as the channel voltage. The word line could be any unselected word line in the block containing memory cells being sensed. The sensing operation could be, for example, a read or a program verify. FIG. 10A also depicts the channel potential of a NAND string during the sensing operation. The sensing operation typically includes applying a read pass voltage (e.g., Vread) to unselected word lines while applying a reference voltage (e.g., Vcgr) to selected word lines. A read pass voltage is a voltage that is sufficient to place the memory cell into a conductive state, assuming that its threshold voltage is within a range of threshold voltages assigned to different data states. It is not required that the read pass voltage have the same magnitude for all memory cells on the string, but that is one possibility. The unselected word lines may include "dummy word lines". Dummy memory cells that are connected to a dummy word line do not store host data (data provided from the host, such as data from a user of the host), while a data memory cell is eligible to store host data.

FIG. 10A shows that the word line voltage starts to ramp at time t1, and reaches Vread by time t2. At time t3 the word line voltage is reduced to a steady state value, which is reached at time t4. The solid line 1010 represents the voltage applied to the word line. The dashed line 1012 represents a time when the word line voltage is floating. Dashed line 1012 shows that the word line voltage is at "Vcreap" after the sensing operation. The voltage may remain at or near Vcreap for a substantial amount of time. Vcreap can be up to about 4 V, for instance. The coupling up occurs while the word line voltages are floating.

For the unselected word lines, including the dummy word lines, the decrease in Vread will cause the memory cells to transition from a conductive state to a non-conductive state. In particular, when the Vread falls below a cutoff level, the channel of the memory cell will become cutoff, e.g., the memory cell will become non-conductive. This cutoff level may occur between time t3 and t4. When a cell becomes non-conductive, it acts as a capacitor in which the control gate is one plate and the channel is another plate. A cell becomes non-conductive when Vcg<Vcutoff or Vcg<(Vth+Vsl), where Vcg is the control gate voltage of the memory cell (the word line voltage), Vth is the threshold voltage of the memory cell and Vsl is the source line voltage which in turn is approximately the voltage at the source terminal of the memory cell. For a cell in the highest programmed state, e.g., the G state, the Vth can be as low as VvG and as high as the Vth at the upper tail of the G state in the Vth distribution 917 in FIG. 9. Vcutoff can therefore be as low as VvG+Vsl or as high as Vth of the G state upper tail+Vsl. As the voltage 1010 decreases from Vcutoff to 0 V, the channel is capacitively coupled down by a similar amount, as represented by plot 1015 in FIG. 10A.

The voltage swing while the channel is cutoff will be larger when Vsl is larger. However, since Vch=Vsl, the minimum downcoupled level of Vch will be essentially independent of Vsl. For example, a 6 V swing in the word line voltage (e.g., Vcutoff=6 V) with Vsl=1 V will result in about the same minimum downcoupled level of Vch as a 5 V swing in the word line voltage (e.g., Vcutoff=5 V) with Vsl=0 V.

The dashed line 1012 represents one example of the coupling up of the word line voltages from t4-t5. The coupling up is depicted as occurring relatively quickly but this is not to scale. In practice, the sensing operation, e.g., from t1-t3, may consume about 100 microseconds, while the coupling up of the word line may be significantly longer, in the millisecond range such as 10 milliseconds. This example assumes the word line voltage has reached its intended minimum ramped down level of Vss=0 V, for instance. When Vwl is subsequently coupled up, it reaches a maximum level of Vwl_coupled_up and the block is in the second read situation. Vwl gradually discharges back to 0 V over a period of several minutes to return the block to the first read situation.

As noted, plot 1015 represents a channel voltage (Vch) during the sensing operation. During the sense operation, Vch may be initially at about 1 V, for instance, for a selected NAND string. Vch is about the same as Vsl for the channels of the selected NAND strings. Vsl is set based on a type of sensing which is used. Examples include negative sensing in which Vsl is about 1 V and positive sensing in which Vsl is about 0 V and a negative word line voltage is used. The techniques described herein apply regardless of the level of Vsl or the type of sensing used.

The channel is capacitively coupled down to a minimum level from t3-t4 and then begins to return to a final level of, e.g., 0 V from t4-t5. If the voltages of the word lines are allowed to float starting at t4, the WL voltages (plot 1012) are capacitively coupled higher by the increase in Vch. In one example, the voltages of the word lines float to a peak level of Vcreap (plot 1012), e.g., about 4 V. The voltages of the word lines are floated by disconnecting the word lines from a word line driver.

The word line voltages may stay at or near Vcreap for a significant time, such that another sensing operation may start in the block while the word line voltages are still crept up. Herein, when a sensing operation starts when the word line voltages are crept up by more than a pre-determined level is referred to as a second read condition. FIG. 10B depicts word line voltages 1020 for a second read condition. Initially, the word line voltages are at Vcreap, in this example. Showing the word line voltages at Vcreap is for purpose of illustration. Over time, the word line voltage will typically drop. In some embodiment, the first read condition is distinguished from the second read condition based on the magnitude of the word line voltage of a representative word line in the block. In FIG. 10B, the voltage Vthresh distinguishes between the first read and second read conditions. Specifically, if the word line voltage is at or above Vthresh, then the second read condition is met. On the other hand, if the word line voltage is below Vthresh, then the first read condition is met. The level of Vthresh that is depicted in FIG. 10B is for purpose of illustration. Vthresh is an example of a pre-determined voltage that may be used to distinguishe between the first read condition and the second read condition.

The inventors have discovered that the peak current consumption when ramping up word line voltages is significantly greater when the first read condition is present than when the second read condition is present. The current needed to charge a word line may be determined based on Equation 1.

$$I = \frac{dQ}{dt} = C\frac{dV}{dt} \quad (1)$$

For the first read condition in FIG. 10A, dV is Vread−Vss. For the second read condition in FIG. 10B, dV is Vread−Vcreap. Equation 1 indicates that the peak current will be larger for the first read condition than the second read condition given that the Vcreap is greater than Vss.

Figure 11:
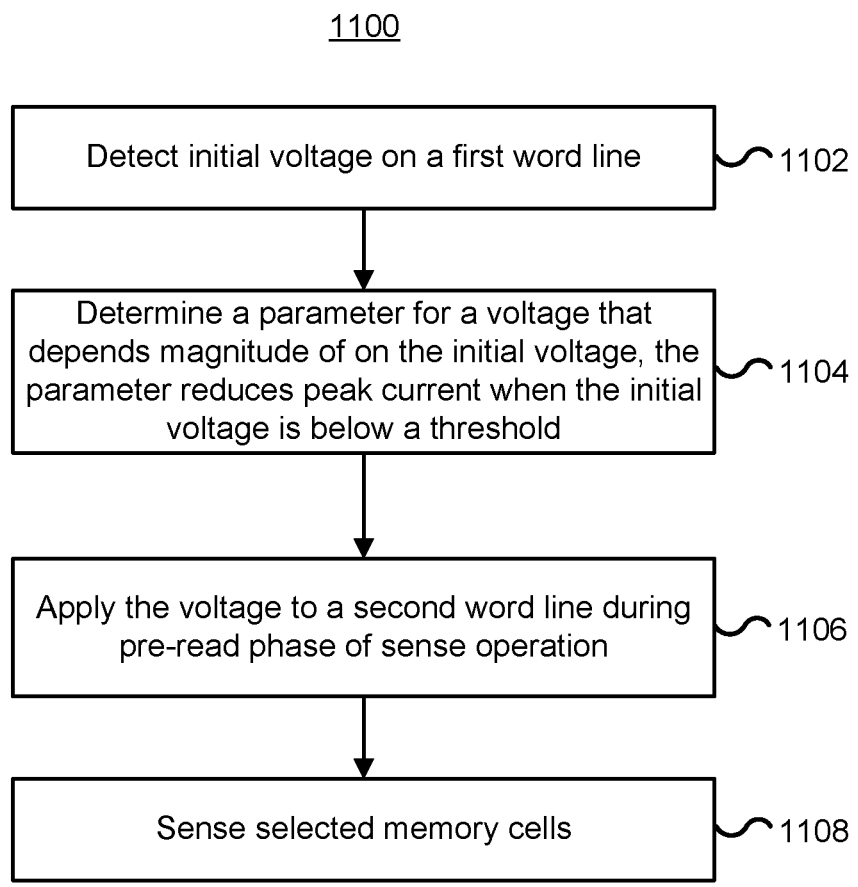
FIG. 11 depicts a flowchart of one embodiment of a process of operating non-volatile storage.

FIG. 11 depicts a flowchart of one embodiment of a process 1100 of operating non-volatile storage. In one embodiment, the process 1100 is used to read memory cells. In one embodiment, the process 1100 is used during a program verify operation. The process 1100 reduces peak current consumption in connection with a sensing operation. The peak current may be reduced just prior to the actual sensing of the memory cells. The inventors have discovered that peak current consumption may be greater in connection with a sensing operation when a first read condition is present than when a second read condition is present. The process 1100 may be used to reduce peak current consumption when a first read condition is present. Therefore, the peak current during sensing operations is reduced, regardless of whether the sensing operation is a first read or a second read.

In one embodiment, process 1100 is used to sense selected non-volatile memory cells on a group of NAND strings. A group of word lines are connected to the control gates of the memory cells, as described herein. The memory cells to be sensed are connected to what is referred to herein as a selected word line. Other word lines, which are connected to the control gates of memory cells that are not be sensed, are referred to herein as unselected word lines. There may also be dummy word lines connected to the control gates of dummy memory cells on the NAND strings.

Step 1102 includes detecting a voltage on a first word line. The first word line is representative of the degree of coupling up (or creep up) of word line voltages in the block, and hence may also be referred to as a representative word line. The representative word line could the selected word line, an unselected word line, or a dummy word line. In one embodiment, a reason for detecting the voltage is to determine whether a first read or a second read condition is present. In one embodiment, a first read condition is present if the voltage is less than a predetermined voltage, and the second read condition is present if the voltage is equal to or greater than the predetermined voltage. Note that all of the word lines that are connected to the NAND strings may experience the coupling up the voltage that is described in FIG. 10A. Thus, in one embodiment, any word line connected to the NAND strings may be selected to be tested in step 1102. In practice, some word lines may be more or less representative of the voltage creep up than others. For example, edge word lines might be less representative than others.

Step 1104 includes determining a value for a parameter for a voltage that depends on a magnitude of the initial voltage. The voltage will be applied to one of the word lines during a pre-read phase of the sense operation. The value for the parameter reduces peak current when the initial voltage is below a threshold. Examples of the parameter include, but are not limited to, a ramp rate, a number of intermediate voltage levels between a start voltage and a final voltage, and a start time.

In one embodiment, the parameter is a ramp rate of a charge pump. The value of the ramp rate can be specified in numerous ways. One way to specify the value of the ramp rate is by the clock frequency of a clock used in a charge pump. For example, with reference to FIGS. 3C and 3D, CLK1a is one value and CLK2 is another value that can be used to specify a ramp rate. A ramp rate can be specified in other ways, such as a ratio of voltage increase divided by time.

Figure 16:
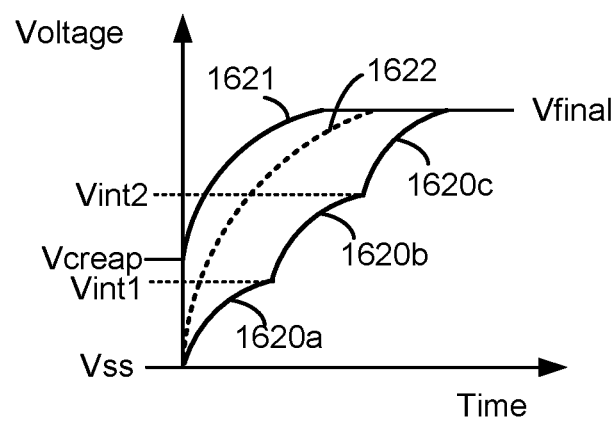
FIG. 16 depicts one embodiment of word line voltages during a first read and a second read condition, which may be used in the process of FIG. 15.

In one embodiment, the parameter is that the voltage has one or more intermediate voltage levels between a start voltage and a final voltage. The value for the parameter is the number of the intermediate voltage levels. For example, with reference to plots 1620a. 1620b, and 1620c in FIG. 16, the voltage has intermediate voltage levels Vint1 and Vint2 between a start voltage (Vss) and a final voltage (Vfinal). FIG. 16 will be discussed in more detail below.

Figure 18:
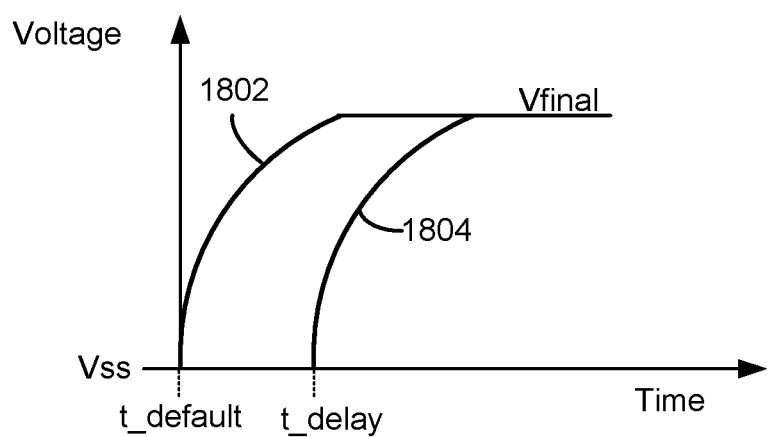
FIG. 18 depicts one embodiment of word line voltages during a first read condition, which may be used in the process of FIG. 17.

In one embodiment, the parameter is a start time of the voltage. For example, with reference to FIG. 18, the value of the start time could be a default start time (t_default) or a delayed start time (t_delay). FIG. 18 will be discussed in more detail below.

Step 1106 includes applying the voltage to a second word line. In one embodiment, the second word line is the selected word line. In one embodiment, the second word line is one of the unselected word lines. In one embodiment, the second word line is a dummy word line. Note that step 1106 may be applied to more than one word line. The voltage is applied during a pre-read phase in preparation of the sensing of the memory cells. In one embodiment, the pre-read voltage is applied during a channel discharge phase of a sense operation. The channel discharge phase discharges channels of the NAND strings. FIGS. 12A-12F depict timing diagrams of one embodiment of voltages applied to control lines during a sense operation having a channel discharge phase. However, the pre-read phase is not required to discharge the NAND channels. The pre-read phase applies a voltage to the selected word line, but the selected memory cells are not sensed during the pre-read phase. Voltages may also be applied to the unselected word lines during the pre-read phase. Thus, as defined herein, a pre-read phase is a phase just prior to an actual sensing of memory cells in which a voltage is applied to the selected word line, but the memory cells are not sensed.

Step 1108 includes sensing the memory cells. The sensing occurs during a sensing phase in which one or more read compare voltages are applied to the selected word line. Read pass voltages (e.g., Vread) are applied to the unselected word lines during the sensing phase. FIGS. 12A-12F depict timing diagrams of voltages during one embodiment of a sense operation having a sensing phase.

In FIG. 12A-12F, the vertical axis denotes voltage and the horizontal axis denotes a common time axis. Also, a time period 1205 at t1-t6 represents a discharge phase of a read operation and a time period 1206 at t6-t12 represents a sensing phase of a sense operation. Within the discharge phase, a discharge period t1-t5 can be defined in which the word line voltages are requested to be at a turn-on level, e.g., a level which is sufficiently high to provide the memory cells in a conductive state. The discharge phase is one embodiment of a pre-read phase.

Figure 12:
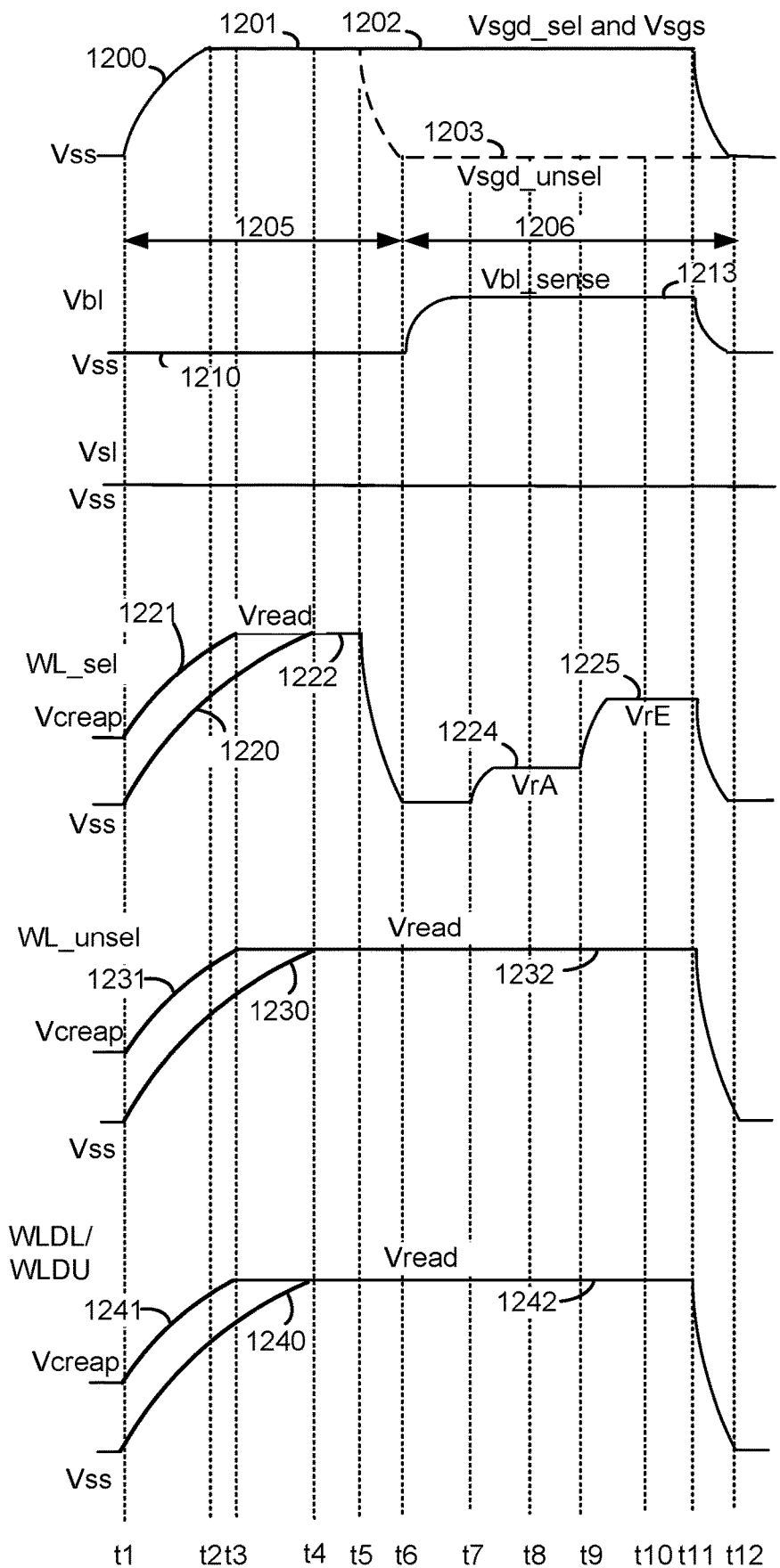
FIGS. 12A-12F depict timing diagrams of voltages during one embodiment of a sense operation having a sensing phase.

FIG. 12A depicts example voltage signals applied to select gate transistors in a sense operation. Vsgd_sel is a voltage applied to the control gates of the SGD transistors in a selected sub-block of a read operation. This is the sub-block with the selected memory cells. Vsgd_unsel is a voltage applied to the control gates of the SGD transistors in unselected sub-blocks of a read operation. Vsgs is a voltage applied to the control gates of the SGS transistors in the block. At t1, the voltages are increased or ramped up from an initial level Vss=0 V, for instance, to a peak level such as 7 V as represented by a plot 1200, and maintained at the fixed level until t5 as represented by a plot 1201. Vsgd_sel and Vsgs continue at the fixed level until t11 (plot 1202). Vsgd_unsel decreases or is ramped down to 0 V from t5-t6 (plot 1203). A finite amount of time (t1-t2) is required to transition the voltages from an initial level to a peak level.

When the SGD voltages are at the peak level (plot 1201) in the discharge phase, the SGD transistors are in a conductive state so that the bit line voltage, e.g., 0 V, is connected to the drain end of the NAND string channel. This creates a discharge path of the channel at the drain end of the NAND string. Also, when the SGS voltages are at the peak level (plot 1201) in the discharge phase, the SGS transistors are in a conductive state so that the source line voltage, e.g., 0 V, is connected to the source end of the NAND string channel. This creates a discharge path of the channel at the source end of the NAND string.

In the reading phase, Vsgd_sel and Vsgs remain at the peak level so that sensing of the NAND strings in the selected sub-block can occur. Vsgd_unsel is set to 0 V so that the associated SGD transistors are in a non-conductive state. This prevents the unselected NAND strings from interfering with the sensing of the selected NAND strings.

FIG. 12B depicts an example voltage signal applied to a selected bit line in a sense operation. As show by a plot 1210, from t1-t6, the bit line voltage, Vbl, may be set to 0 V during the discharge phase to help discharge the voltage of the NAND string channels from the drain end of the NAND strings. At t6, Vbl is increased to a sensing voltage, Vbl_sense (plot 1213), as discussed in connection with FIG. 2. During sensing for each read voltage, the sense node voltage of the sense circuit may remain relatively steady or may decay. If the sense node voltage decays below a specified trip voltage, the selected memory string is considered to be in a conductive state and the Vth of the selected memory cell is below the read voltage, in one embodiment. The determination of whether the sense node voltage decays below the trip voltage is made at t8 and t10 for sensing relative to VrA and VrE, respectively, in this example. If the sense node voltage does not decay below the trip voltage, the selected memory string is considered to be in a non-conductive state and the Vth of the selected memory cell is equal to or above the demarcation voltage. The bit line voltage is ramped down to Vss at t11.

FIG. 12C depicts an example voltage signal applied to a source line in a sense operation. The source line voltage Vsl is fixed at Vss=0 V in this example. Vsl is common to all NAND strings in a block, in one approach. During the discharge phase, setting Vsl=0 V helps to discharge the voltage of the NAND string channels from the source end of the NAND strings. During the read phase, setting Vsl=0 V allows a current to flow from the drain end to the source end since Vbl_sense>Vsl.

FIG. 12D depicts example voltage signals applied to a selected word line, WLn, in a sense operation. At the start of the discharge phase, at t1, the selected word line voltage is ramped up from the WL initial voltage to a peak level Vread. Two different initial voltages are depicted to represent a first read condition and a second read condition. Plot 1220 represents a first read condition in which the voltage is ramped up from Vss to Vread from t1-t4. Plot 1221 represents a second read condition in which the voltage is ramped up from Vcreap to Vread from t1-t3. After the ramp up, the selected word line voltage is held at Vread (plot 1222), then ramped back down to Vss from t5-t6. By providing the selected word line voltage at a sufficiently high level, the associated memory cells are provided in a conductive state to allow the channel to discharge in the discharge phase.

During the read phase, the selected word line voltage is increased from Vss to VrA at t7, remains at VrA until t9 (plot 1224), is increased from VrA to VrE at t9, remains at VrE until t11 (plot 1225), and is then decreased back to Vss at t11.

FIG. 12E depicts example voltage signals applied to unselected data word lines in a sense operation. At the start of the discharge phase, at to, the unselected data word line voltage is ramped up from the WL initial voltage to a peak level Vread. Two different initial voltages are depicted to represent a first read condition and a second read condition. Plot 1230 represents a first read condition in which the voltage is ramped up from Vss to Vread from t1-t4. Plot 1231 represents a second read condition in which the voltage is ramped up from Vcreap to Vread from t1-t3. After the ramp up, the unselected word line voltage is held at Vread (plot 1232). By providing the unselected word line voltage at a sufficiently high level, the associated memory cells are provided in a conductive state to allow the channel to discharge in the discharge phase, and to allow reading to occur in the read phase.

During the read phase, the unselected word line voltage is held at Vread then decreased back to Vss at t11.

FIG. 12F depicts example voltage signals applied to dummy word lines in a read operation. At the start of the discharge phase, at t1, the dummy word lines voltage is ramped up from the WL initial voltage to a peak level Vread. Two different initial voltages are depicted to represent a first read condition and a second read condition. Plot 1240 represents a first read condition in which the voltage is ramped up from Vss to Vread from t1-t4. Plot 1241 represents a second read condition in which the voltage is ramped up from Vcreap to Vread from t1-t3. After the ramp up, the dummy word line voltage is held at Vread (plot 1242). By providing the dummy word line voltage at a sufficiently high level, the associated memory cells are provided in a conductive state to allow the channel to discharge in the discharge phase, and to allow the reading to occur in the read phase.

Figure 13:
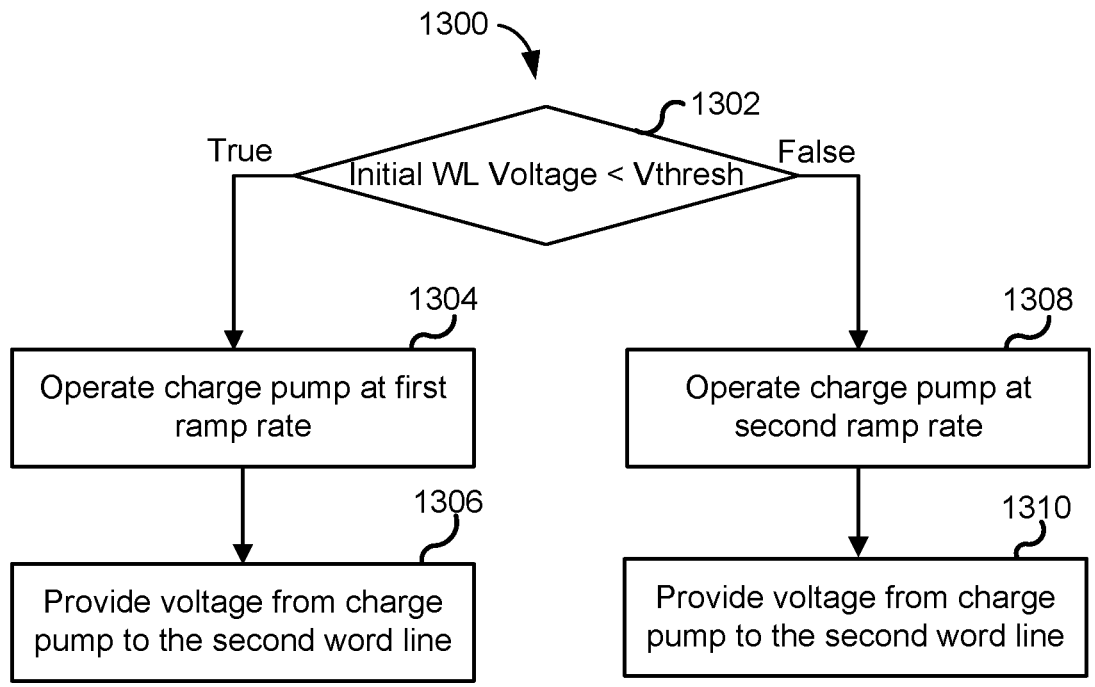
FIG. 13 is a flowchart of one embodiment of a process for controlling a parameter for a voltage during a pre-read phase of a sense operation.

FIG. 13 is a flowchart of one embodiment of a process 1300 for controlling a parameter for a voltage during a pre-read phase of a sense operation. The process 1300 may be used during steps 1102 and 1106 of process 1100. Step 1302 may be used when detecting the initial voltage on the word line in step 1102. Steps 1304-1310 may be performed during step 1106. The first word line referred to in process 1300 is the first word line that is tested in step 1102. For example, the first word line is the word line that is representative of the degree of coupling op of word line voltages in the block. The second word line referred to in process 1300 is the second word line referred to in step 1106.

Step 1302 includes a determination of whether the initial word line voltage is greater than Vthresh. An initial voltage that is less than Vthresh indicates a first read condition. An initial voltage that is equal to or greater than Vthresh indicates a second read condition. As noted in the discussion of process 1100, the word line that is tested could be any word line connected to the NAND strings.

Steps 1304-1306 are performed when the initial voltage that is less than Vthresh. Thus, steps 1304-1306 may be performed when the first read condition is met. Step 1304 includes operating one more charge pumps at first ramp rate in order to provide voltages to word lines in preparation the sense operation. FIG. 3C depicts one example of operating a charge pump at the first ramp rate (noting that the ramp rate in FIG. 3C is slower than the ramp rate in FIG. 3D). Step 1306 includes providing the voltage from the charge pump to the second word line. Note that the first ramp rate is a slower ramp rate than will be discussed in step 1308.

Steps 1304 and 1306 may be used to provide voltages to any of the word lines. In one embodiment, steps 1304 and 1306 are used to provide a voltage to the selected word line during the pre-read phase. In one embodiment, steps 1304 and 1306 are used to provide a voltage to one or more unselected word lines during the pre-read phase. In one embodiment, steps 1304 and 1306 are used to provide a voltage to one or more dummy word lines during the pre-read phase. Steps 1304 and 1306 may be used for any combination of the selected word line, the unselected word line, and the dummy word lines. Note that not all of the word lines are required to have the slower ramp rate in steps 1304-1306. For example, the selected word line might have the slower ramp rate (see, for example, FIG. 3C), but the unselected word lines may might the faster ramp rate (see, for example, FIG. 3D). However, peak current consumption can still be reduced. Note that peak current consumption may be more of an issue for some word lines than for others due to factors such as the final magnitude of the voltage applied to a word line during the pre-read phase. Note that not all word lines are required to have the same magnitude voltage during the pre-read phase.

Steps 1308 and 1310 are performed when the initial voltage on the first (or representative) word line is equal to or greater than Vthresh. Thus, step 1308 may be performed when the second read condition is met. Step 1308 includes operating charge pumps at a second ramp rate in order to provide voltages to word lines in preparation the sense operation. Step 1310 includes providing the voltage from the charge pump to the second word line. The second ramp rate is faster than the first ramp rate of step 1304. FIG. 3D depicts one example of operating the charge pump at the second ramp rate. As can be seen in FIGS. 3C and 3D, the clock rate can be selected to control the ramp rate of the charge pump.

By operating at least one charge pump at the slower ramp rate in step 1304 (as in FIG. 3C), peak current is reduced when the first read condition is present. In other words, had the charge pump been operated at the faster rate depicted in FIG. 3D when the first read condition is met, the peak current would be higher.

Figure 14:
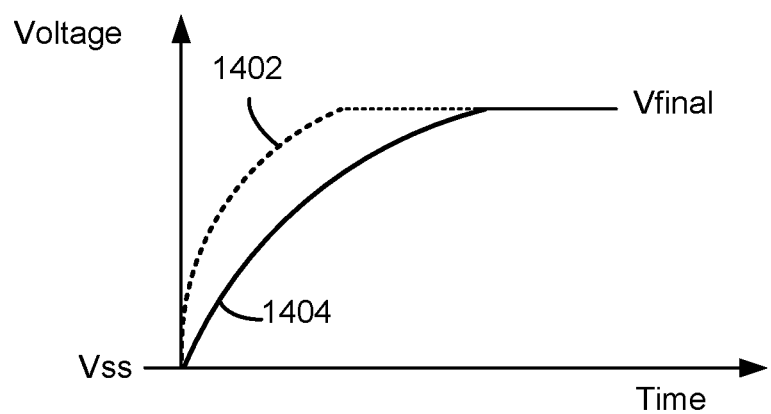
FIG. 14 depicts word line voltages to help illustrate how peak current can be reduced during the first read condition.

FIG. 14 depicts word line voltages to help illustrate how peak current can be reduced during the first read condition. The solid plot 1404 represents the voltage on the word line during step 1306. The dashed plot 1402 represents a voltage that could occur on the word line during step 1306 if a faster ramp rate had been used. For example, plot 1404 may correspond to the faster ramp rate in FIG. 3D, and plot 1402 may correspond to the slower ramp rate in FIG. 3C. In one embodiment, a factor in reducing peak current is to increase the time it takes to increase the word line voltage from Vss to Vfinal. For example, increasing the time it takes to increase the word line voltage from Vss to Vfinal may reduce peak current.

With reference to FIG. 12D, in one embodiment, the faster ramp rate (e.g., FIG. 3D) is used to provide the voltage for plot 1221 and the slower ramp rate (e.g., FIG. 3C) is used to provide the voltage for plot 1220. With reference to FIG. 12E, in one embodiment, the faster ramp rate (e.g., FIG. 3D) is used to provide the voltage for plot 1231 and the slower ramp rate (e.g., FIG. 3C) is used to provide the voltage for plot 1230. With reference to FIG. 12F, in one embodiment, the faster ramp rate (e.g., FIG. 3D) is used for plot 1241 and the slower ramp rate (e.g., FIG. 3C) is used to provide the voltage for plot 1240. Note that in some embodiments other techniques than using a slower ramp rate are used to reduce peak current during the channel discharge phase when the first read condition is present. Also note that the slower ramp rate is not required to be used for all word lines in the block when the first read condition is present, but this is one option.

Figure 15:
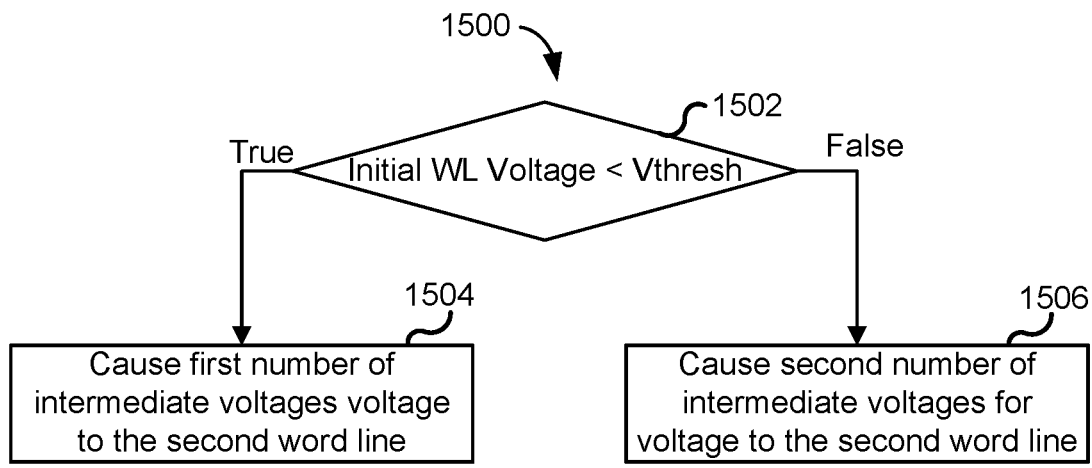
FIG. 15 is a flowchart of one embodiment of a process for controlling a parameter for a voltage during a pre-read phase of a sense operation.

FIG. 15 is a flowchart of one embodiment of a process 1500 for controlling a parameter for a voltage during a pre-read phase of a sense operation. The process 1500 may be used during steps 1102 and 1106 of process 1100. Step 1502 may be used when detecting the initial voltage on the word line in step 1102. Steps 1504-1510 may be performed during step 1106. The first word line referred to in process 1500 is the first word line that is tested in step 1102. The second word line referred to in process 1500 is the second word line referred to in step 1106.

Step 1502 includes a determination of whether the initial word line voltage is greater than Vthresh. An initial voltage that is less than Vthresh indicates a first read condition. An initial voltage that is equal to or greater than Vthresh indicates a second read condition. As noted in the discussion of process 1100, the word line that is tested could be any word line connected to the NAND strings.

Step 1504 is performed when the initial voltage that is less than Vthresh. Thus, step 1504 may be performed when the first read condition is present. Step 1504 includes causing a first number of intermediate voltages for the voltage on the second word line during the pre-read phase of the sense operation.

Step 1506 is performed when the initial voltage on the first word line is equal to or greater than Vthresh. Thus, step 1506 may be performed when the second read condition is present. Step 1506 includes causing a second number of intermediate voltages for the voltage on the second word line during the pre-read phase of the sense operation. The second number of intermediate voltages is less than the first number of intermediate voltages. Using a greater number of intermediate voltages reduces peak current relative to a lesser number of intermediate voltages.

FIG. 16 depicts one embodiment of word line voltages during a first read and a second read condition, which may be used in process 1500. Plot 1621 represents a voltage that may be used during a second read condition. The voltage starts at Vcreap and increases to Vfinal without any intermediate voltages. In other words, plot 1621 does not have any discontinuities. Plot 1620 represents a voltage that may be used during a first read condition. Plot 1620 is divided into three sections 1620a, 1620b, and 1620c, based on the intermediate voltages Vint1 and Vint2. In other words, plot 1620 has discontinuities, which occur at the intermediate voltages. Stated another way, there is a discontinuity between plot 1620a and plot 1620b. There is another discontinuity between plot 1620b and 1620c.

Plot 1622 represents the voltage that would have appeared on the word line during the first read condition if the intermediate voltages were not used. One effect of using the intermediate voltages is to increase the time it takes to charge the word line from Vss to Vfinal. Having the intermediate voltages in plot 1620 reduces the peak current consumption relative to if a fewer or no intermediate voltages were used. Note that it is not required to use plot 1620 for all word lines when the first read condition is present, but that is one option. For example, some word lines could receive a voltage resembling plot 1620 and others plot 1622, while still reducing peak current.

The example of FIG. 16 shows two intermediate voltages for plot 1620 and no intermediate voltages for plot 1621. Plot 1621 could have one or more intermediate voltages, provided that plot 1620 has at least one more intermediate voltage than plot 1621. In one embodiment, plot 1621 is modified to have one intermediate voltage, with plot 1620 having two or more intermediate voltages. In one embodiment, plot 1620 is modified to have only one intermediate voltage.

Figure 16A:
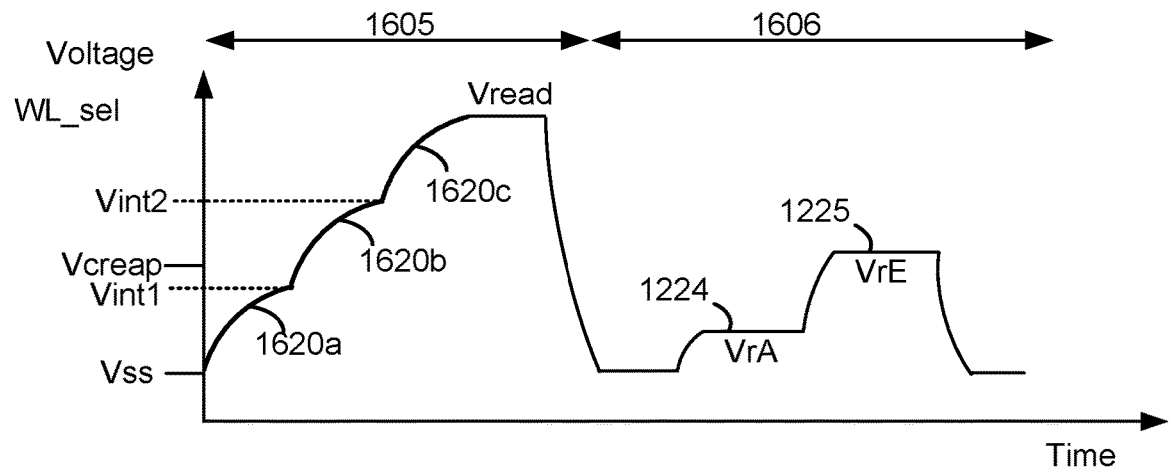
FIG. 16A depicts one embodiment of the voltage on the selected word line when the first read condition is present.

With reference to FIG. 12D, in one embodiment, the lower number of intermediate voltages (e.g., plot 1621) is used instead of plot 1221 and the greater number of intermediate voltages (e.g., plot 1620) is used instead of plot 1220. Note that in FIG. 12D, plot 1221 does not have any intermediate voltages, but it could have one or more intermediate voltages provided that plot 1220 has more intermediate voltages. FIG. 16A depicts one embodiment of the voltage on the selected word line when the first read condition is present. The diagram is consistent with modifying plot 1220 in FIG. 12D with plot 1620. FIG. 16A depicts a pre-read phase 1605 and a sense phase 1606 of a sense operation.

Figure 16B:
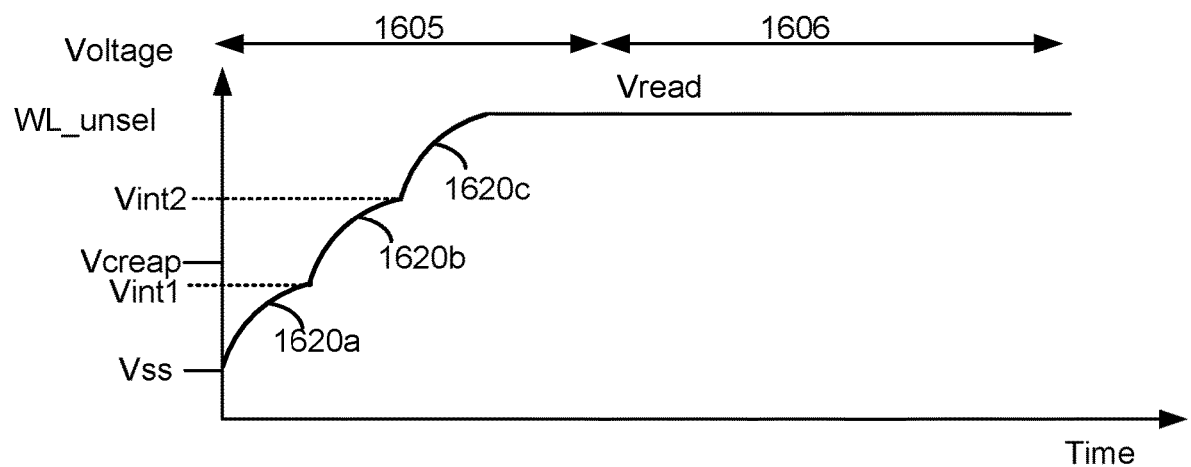
FIG. 16B depicts one embodiment of the voltage on unselected word lines when the first read condition is present.

With reference to FIG. 12E, in one embodiment, the lower number of intermediate voltages (e.g., plot 1621) is used instead of plot 1231 and the greater number of intermediate voltages (e.g., plot 1620) is used instead of plot 1230. FIG. 16B depicts one embodiment of the voltage on unselected word lines when the first read condition is present. The diagram is consistent with modifying plot 1230 in FIG. 12E with plot 1620. FIG. 16B depicts the pre-read phase 1605 and the sense phase 1606 of the sense operation of FIG. 16A.

With reference to FIG. 12F, in one embodiment, the lower number of intermediate voltages (e.g., plot 1621) is used instead of plot 1241 and the greater number of intermediate voltages (e.g., plot 1620) is used instead of plot 1240. Note that in some embodiments other techniques than using a greater number of intermediate voltages are used to reduce peak current during the channel discharge phase when the first read condition is present.

Figure 17:
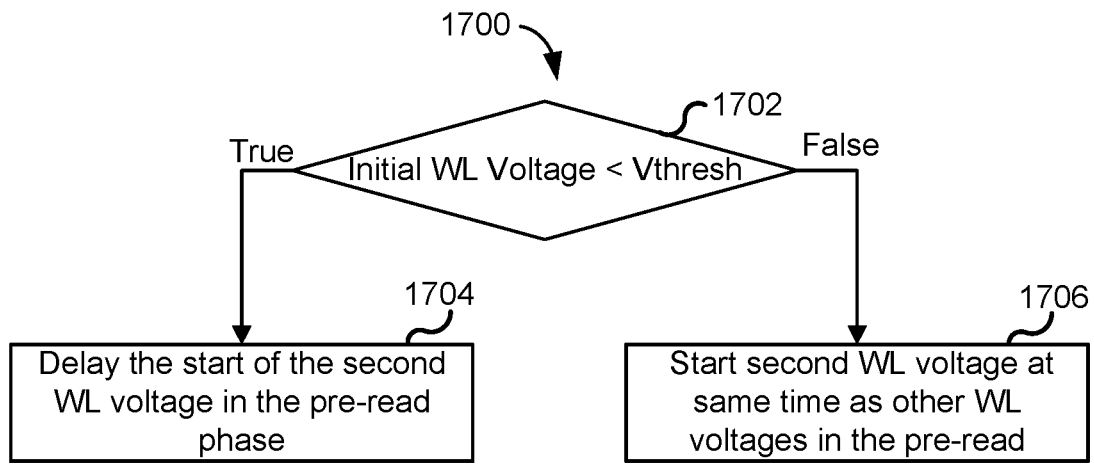
FIG. 17 is a flowchart of one embodiment of a process for controlling a parameter for a voltage during a pre-read phase of a sense operation.

FIG. 17 is a flowchart of one embodiment of a process 1700 for controlling a parameter for a voltage during a pre-read phase of a sense operation. The process 1700 may be used during steps 1102 and 1106 of process 1100. Step 1702 may be used when detecting the initial voltage on the word line in step 1102. Steps 1704-1706 may be performed during step 1106. The first word line referred to in process 1700 is the first word line that is tested in step 1102. The second word line referred to in process 1700 is the second word line referred to in step 1106.

Step 1702 includes a determination of whether the initial word line voltage of the first (e.g., representative) word line is greater than Vthresh. An initial voltage that is less than Vthresh indicates a first read condition. An initial voltage that is equal to or greater than Vthresh indicates a second read condition. As noted in the discussion of process 1100, the word line that is tested could be any word line connected to the NAND strings.

Step 1704 is performed when the initial voltage that is less than Vthresh. Thus, step 1704 may be performed when the first read condition is present. Step 1704 includes delaying the start of the second word line voltage during the pre-read phase of the sense operation. This means to delay the start of the second word line voltage relative to the start of the voltage on at least one other word line. In some embodiment, the voltage on multiple word lines is delayed relative to others. In step 1704, not every word line has its voltage started at the same time. Note that step 1704 occurs during the pre-read phase.

Step 1706 is performed when the initial voltage on the first word line is equal to or greater than Vthresh. Thus, step 1706 may be performed when the second read condition is present. Step 1706 includes starting all of the word line voltages at the same time during the pre-read phase of the sense operation.

FIG. 18 depicts one embodiment of word line voltages during a first read condition, which may be used in process 1700. Plot 1804 represents a word line voltage that is delayed relative to the word line voltage of plot 1802. That is, plot 1802 starts at a default time referred to as default, whereas plot 1804 starts at a delayed time referred to as t_delay. Both of these voltages are used during step 1704 (the first read condition). Delaying the start of the voltage to at least one word line when the first read condition is present reduces peak current during the pre-read phase. The word line for which the voltage is delayed can be any word line in the block. In general, a set of one or more word lines have their voltages delayed relative to others. Clearly, the set of word lines that have their voltages delayed must be less than all word lines in the block. In one embodiment, the set that is delayed includes the selected word line. In one embodiment, the set that is delayed includes one or more unselected word lines. In one embodiment, the set that is delayed includes one or more dummy word lines.

With reference to FIG. 12D, in one embodiment, plot 1221 has a default start time and plot 1220 has a delayed start time (with reference to the default start time). With reference to FIG. 12E, in one embodiment, plot 1231 has a default start time and plot 1230 has a delayed start time. With reference to FIG. 12F, in one embodiment, plot 1231 has a default start time and plot 1230 has a delayed start time. Note that in some embodiments other techniques than delaying the start time of the voltage on at least one word line are used to reduce peak current during the channel discharge phase when the first read condition is present.

Figure 18A:
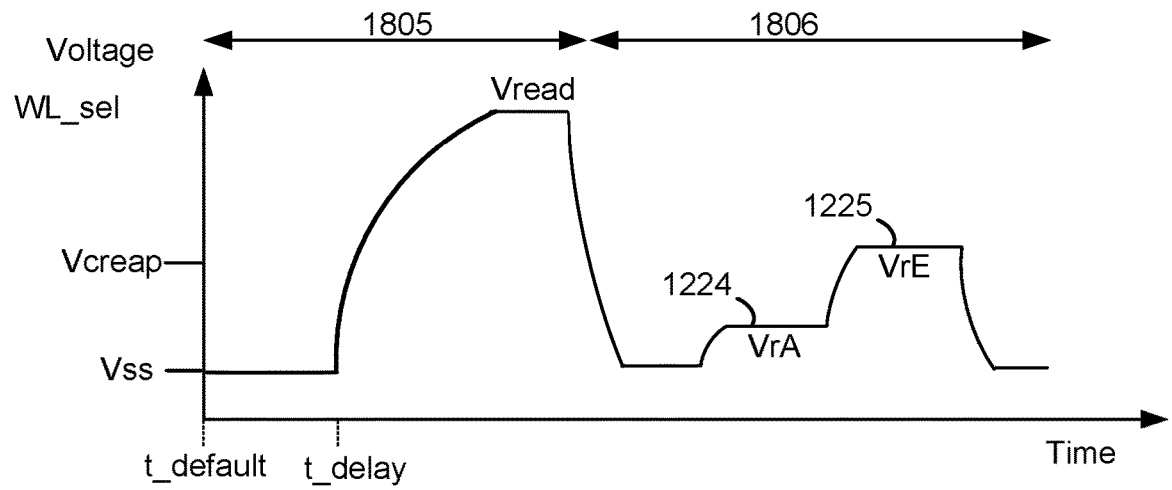
FIGS. 18A and 18B depict one embodiment of the voltages on the selected word line and unselected word lines when the first read condition is present.
Figure 18B:
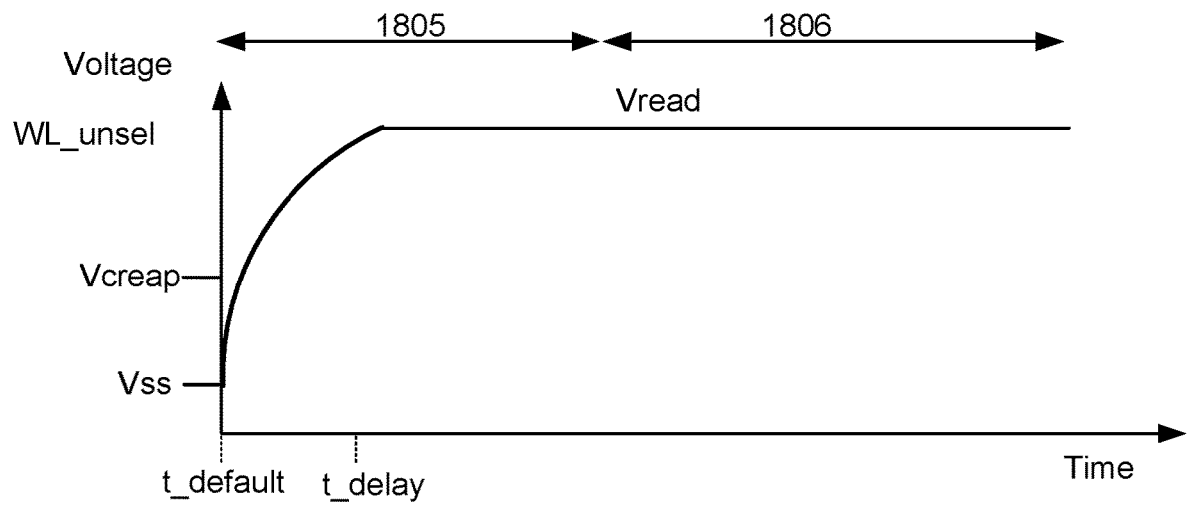

FIGS. 18A and 18B depict one embodiment of the voltages on the selected word line and unselected word lines when the first read condition is present. FIG. 18A depicts a pre-read phase 1805 and a sense phase 1806 of a sense operation. FIG. 18B depicts the pre-read phase 1805 and the sense phase 1806 of the sense operation of FIG. 18A. FIG. 18A is consistent with modifying FIG. 12D to add a delay to the selected word line. The unselected word lines are not delayed. Thus, t_default corresponds to t1 in FIG. 12E. Thus, in FIG. 18A the selected word line voltage starts at time t_delay, whereas the unselected word line voltages in FIG. 18B start at t_default. Many variations of FIGS. 18A and 18B are possible by selecting other word lines to start at t_delay. For example, the selected word line could start at t_default and one or more of the unselected word lines could start at t_delay. In one embodiment, one or more dummy word lines start at t_delay.

Figure 19:
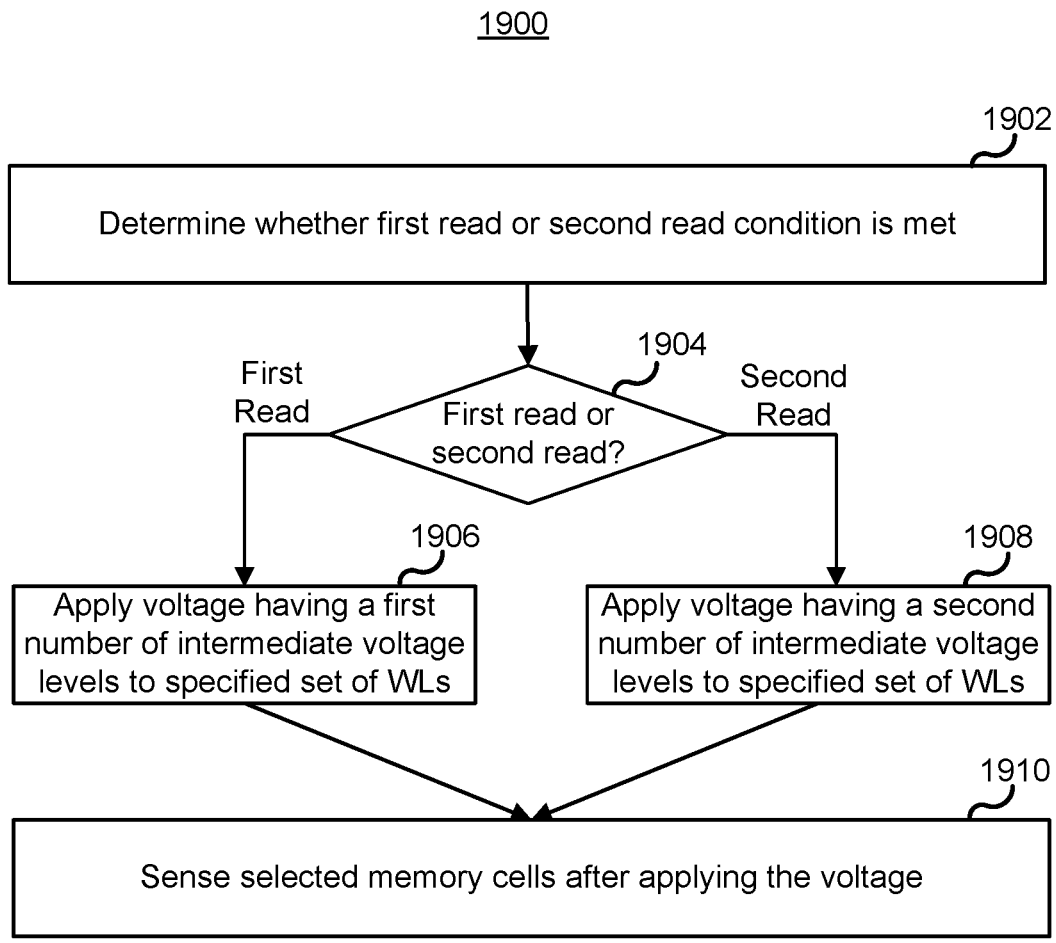
FIG. 19 depicts a flowchart of one embodiment of a process of operating non-volatile storage.

FIG. 19 depicts a flowchart of one embodiment of a process 1900 of operating non-volatile storage. In one embodiment, the process 1900 is used to read memory cells. In one embodiment, the process 1900 is used during a program verify operation. The process 1900 reduces peak current consumption. The process 1900 may be used to reduce peak current consumption when a first read condition is present. Therefore, the peak current during sensing operations is reduced, regardless of whether the sensing operation is a first read or a second read.

In one embodiment, process 1900 is used to sense selected non-volatile memory cells on a group of NAND strings. A group of word lines are connected to the control gates of the memory cells, as described herein. The memory cells to be sensed are connected to what is referred to herein as a selected word line. Other word lines, which are connected to the control gates of memory cells that are not be sensed, are referred to herein as unselected word lines. There may also be dummy word lines connected to the control gates of dummy memory cells on the NAND strings.

Step 1902 includes determining whether a first read or a second read condition is met. In one embodiment, step 1902 includes detecting a voltage on a word line connected to the NAND strings. The word line could the selected word line, an unselected word line, or a dummy word line. In one embodiment, a first read condition is present if the voltage is less than a predetermined voltage, and the second read condition is present if the voltage is equal to or greater than the predetermined voltage. Note that all of the word lines that are connected to the NAND strings may experience the coupling up the voltage that is described in FIG. 10A. Thus, in one embodiment, any word line connected to the NAND strings may be selected to be tested in step 1902.

However, other techniques may be used to determine whether a first read or a second read condition is met. In one embodiment, the determination is made based on an amount of time since the last time that memory cells in the group were read. In one embodiment, timer 119 is used to track the amount time since the last sense operation involving any of the NAND strings. If the time is greater than a pre-determined time, then the first read condition is met. If the time is less than or equal to the pre-determined time, then the second read condition may be met. However, other factors to be discussed below may result in a first read condition even if the time is less than the pre-determined time. As has been noted above, the voltage on the word lines may creep up as a result of sensing operation (see FIG. 10A). This voltage may slowly discharge. In one embodiment, the pre-determined time is chosen such that the word line voltage will be about Vthresh (see FIG. 10B).

Still other techniques may be a factor to determine whether a first read or a second read condition is met. In one embodiment, when the storage device is powered on all of the memory cells are placed into the first read condition. For example, when the storage device is powered on a check for bad blocks may be made in which 0 V or another low voltage is applied to each the word lines. As a result any coupling of the word lines is discharged.

The word lines can also be discharged when the block is inactive while an operation is performed in another block. Therefore, as noted above, even if the last sense operation on the NAND strings was less than the pre-determined time, the first read condition is met if the storage device is reset (e.g., powered on) or if a memory operation is performed on memory cells in another block, in one embodiment.

Step 1904 represents a decision of what action to take based on whether the first read or the second read condition is present. When the first read condition is met, step 1906 is performed. Step 1906 includes causing a first number of intermediate voltages for the voltage on a specified set of word lines during the pre-read phase of the sense operation. The specified set of word lines includes one or more word lines. The specified set of word lines may include the selected word line, one or more unselected word lines, and/or one or more dummy word lines. Note the step 1906 may be performed during the pre-read phase 1605 of FIGS. 16A and/or 16B. For example, with reference to selected word line voltage in FIG. 16A, the portion labeled 1620*a*, 1620*b*, and 1620*c* is applied to the selected word line. The portion labeled Vread may also be applied to the selected word line. As another example, with reference to unselected word line voltages in FIG. 16B, the portion labeled 1620*a*, 1620*b*, and 1620*c* is applied to the unselected word lines.

Step 1908 is performed when second read condition is met. Step 1908 includes causing a second number of intermediate voltages for the voltage on the specified set of word lines during the pre-read phase of the sense operation. The second number of intermediate voltages is less than the first number of intermediate voltages. Using a greater number of intermediate voltages reduces peak current relative to a lesser number of intermediate voltages.

The example of FIG. 16, which has been discussed above, may also be applied to process 1900. Plot 1621 represents a voltage that may be used during a second read condition in step 1908. Plot 1620 represents a voltage that may be used during a first read condition in step 1906. Plot 1622 represents the voltage that would have appeared on the word line during the first read condition if the intermediate voltages were not used. One effect of using the intermediate voltages is to increase the time it takes to charge the word line from Vss to Vfinal. Having the intermediate voltages in plot 1620 reduces the peak current consumption relative to if a fewer or no intermediate voltages were used.

Step 1910 includes sensing the selected memory cells after applying the voltage to the set of specific word lines. Step 1910 includes applying one or more read compare voltages to a selected word line. Note the step 1910 may be performed during the sense phase 1606 of FIGS. 16A and/or 16B. For example, with reference to first read case in FIGS. 16A and 16B, the memory cells are sensed when applying VrA and VrE to the selected word line. Other read compare voltages could be used.

Figure 20:
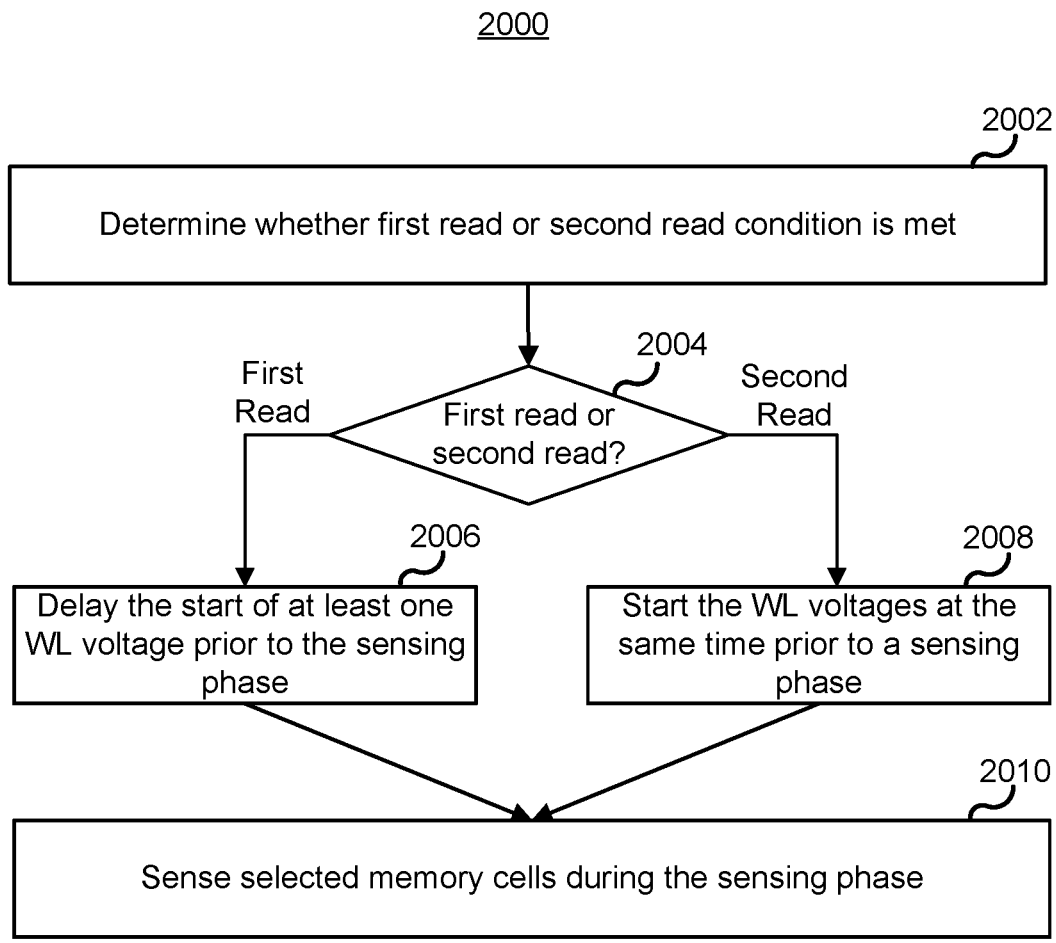
FIG. 20 depicts a flowchart of one embodiment of a process of operating non-volatile storage.

FIG. 20 depicts a flowchart of one embodiment of a process 2000 of operating non-volatile storage. In one embodiment, the process 2000 is used to read memory cells. In one embodiment, the process 2000 is used during a program verify operation. The process 2000 reduces peak current consumption. The process 2000 may be used to reduce peak current consumption when a first read condition is present. Therefore, the peak current during sensing operations is reduced, regardless of whether the sensing operation is a first read or a second read.

In one embodiment, process 2000 is used to sense selected non-volatile memory cells on a group of NAND strings. A group of word lines are connected to the control gates of the memory cells, as described herein. The memory cells to be sensed are connected to what is referred to herein as a selected word line. Other word lines, which are connected to the control gates of memory cells that are not be sensed, are referred to herein as unselected word lines. There may also be dummy word lines connected to the control gates of dummy memory cells on the NAND strings.

Step 2002 includes determining whether a first read or a second read condition is met. In one embodiment, step 2002 includes detecting a voltage on a word line connected to the NAND strings. The word line could the selected word line, an unselected word line, or a dummy word line. In one embodiment, a first read condition is present if the voltage is less than a predetermined voltage, and the second read condition is present if the voltage is equal to or greater than the predetermined voltage. Note that all of the word lines that are connected to the NAND strings may experience the coupling up the voltage that is described in FIG. 10A. Thus, in one embodiment, any word line connected to the NAND strings may be selected to be tested in step 2002.

However, other techniques may be used to determine whether a first read or a second read condition is met. In one embodiment, the determination is made based on an amount of time since the last time that memory cells in the group were read. In one embodiment, timer 119 is used to track the amount time since the last sense operation involving any of the NAND strings. If the time is greater than a pre-determined time, then the first read condition is met. If the time is less than or equal to the pre-determined time, then the second read condition may be met. However, other factors to be discussed below may result in a first read condition even if the time is less than the pre-determined time. As has been noted above, the voltage on the word lines may creep up as a result of sensing operation (see FIG. 10A). This voltage may slowly discharge. In one embodiment, the pre-determined time is chosen such that the word line voltage will be about Vthresh (see FIG. 10B).

Still other techniques may be a factor to determine whether a first read or a second read condition is met. In one embodiment, when the storage device is powered on all of the memory cells are placed into the first read condition. For example, when the storage device is powered on a check for bad blocks may be made in which 0 V or another low voltage is applied to each the word lines. As a result any coupling of the word lines is discharged.

The word lines can also be discharged when the block is inactive while an operation is performed in another block. Therefore, as noted above, even if the last sense operation on the NAND strings was less than the pre-determined time, the first read condition is met if the storage device is reset (e.g., powered on) or if a memory operation is performed on memory cells in another block, in one embodiment.

Step 2004 represents a decision of what action to take based on whether the first read or the second read condition is present. When the first read condition is met, step 2006 is performed. When the second read condition is met, step 2008 is performed. Step 2006 or 2008 (whichever is performed) occurs prior to a sensing phase, which occurs in step 2010. In one embodiment, steps 2006/2008 are performed during a channel discharge phase, an example of which was discussed in connection with FIGS. 12A-12F. However, steps 2006/2008 are not required to be performed in a channel discharge phase. In one embodiment, steps 2006/2008 are performed in a pre-read phase in which a voltage is applied to selected word line, but the memory cells are not sensed. In one embodiment of the pre-read phase voltages are also applied to the unselected word lines and to the dummy word lines.

Step 2006 includes delaying the start of at least one word line voltage prior to the sensing phase of the sense operation. This refers to delaying the start of at least one word line voltage relative to at least one other word line voltage. Stated another way, different word line voltages start at different times. The voltages in FIG. 18, which were described above, may be used during step 2006. Plot 1804 represents a word line voltage that is delayed relative to the word line voltage of plot 1802. Both of these voltages are used during step 2006 (the first read condition). Delaying the start of the voltage to at least one word line when the first read condition is present reduces peak current. Note that step 2006 may be performed during the pre-read phase 1805 in FIGS. 18A and 18B. For example, the selected word line voltage may be delayed, such that it starts at time t_delay.

Step 2008 is performed when second read condition is met. Step 2008 includes starting all of the word line voltages at the same time. Note that step 2006 may be performed during a pre-read phase of a sense operation having a pre-read phase and a sense phase.

Step 2010 includes sensing the selected memory cells during the sensing phase. Step 2010 includes applying one or more read compare voltages to a selected word line. For example, with reference to FIG. 18A, the memory cells may be sensed while applying VrA and VrE to the selected word line during the sense phase 1806. Other read compare voltages could be used.

Figure 21:
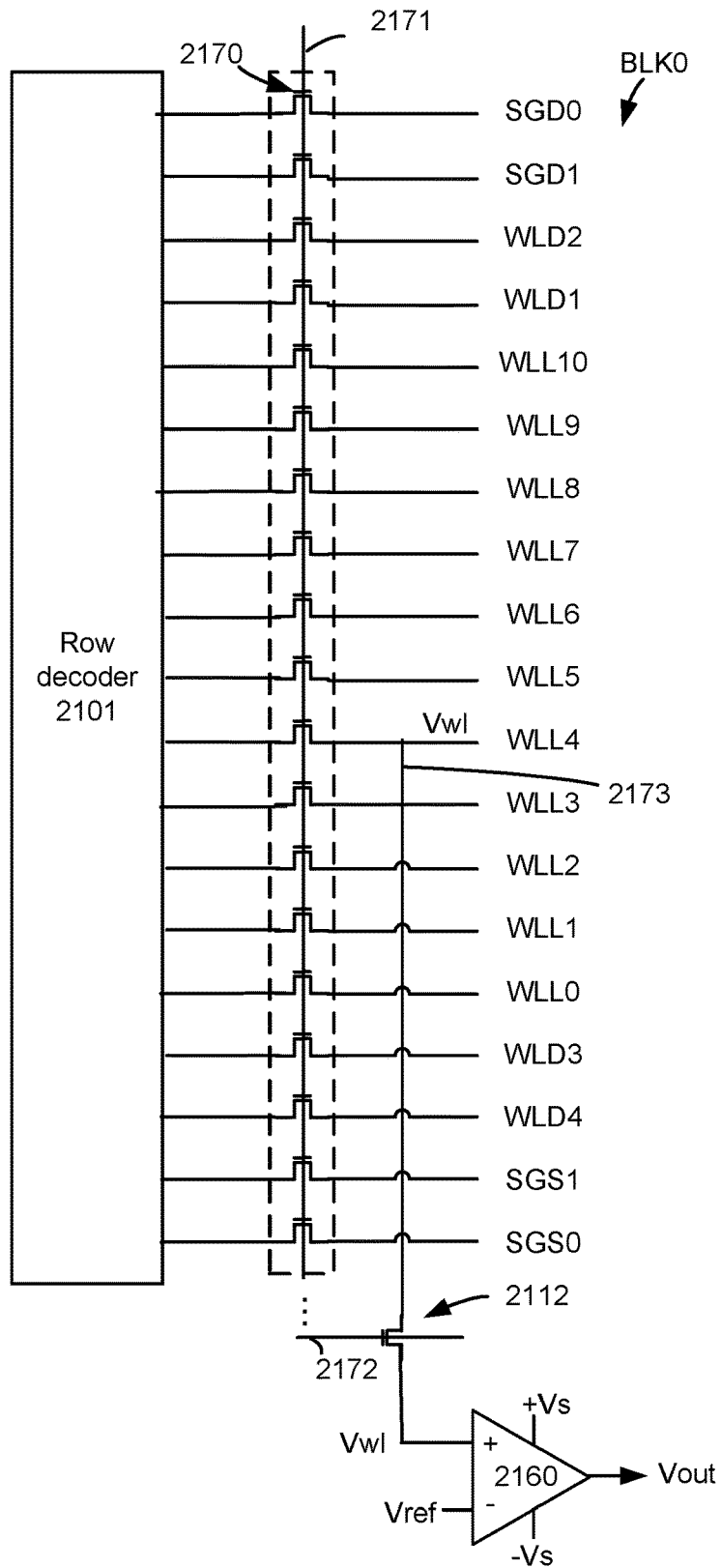
FIG. 21 depicts an example circuit for detecting a word line voltage.

FIG. 21 depicts an example circuit for detecting a word line voltage. The circuit may be used in, for example, steps 1102, 1302, 1502, 1702, 1902, and/or 2002 to detect the first (or representative) word line voltage. The word lines and select gate lines (control lines) for BLK0 are depicted. A pass gate is connected to each control line. For example, a pass gate 2170 is connected to the SGD0 control line. The control gates of the pass gates are connected to a common path 2171. When a voltage on the path is sufficiently high, the control lines are connected to the voltage drivers via the row decoder 2101. When the voltage on the path is sufficiently low, the control lines are disconnected from the voltage drivers and floated.

In this example, a word line voltage is obtained from WLL4 via a conductive path 2173 which is connected to the word line voltage detector 2160 when a control signal on a line 2172 is sufficiently high to make a pass gate 2112 conductive. The word line voltage detector can comprise a comparator. The comparator includes a non-inverting input which receives the word line voltage, Vwl, an inverting input which receives a reference voltage Vref, positive and negative power supplies +Vs and −Vs, respectively and an output which provides Vout. Vout=+Vs if Vwl>Vref and Vout=−Vs if Vwl<Vref. The analog output value can be provided to a controller which converts it to a 0 or 1 bit to represent Vwl>Vref or Vwl<Vref, respectively. If the bit=0, the controller can select one set of read voltages. If the bit=1, the controller can select another set of read voltages. Moreover, Vwl can be compared to different values of Vref to classify Vwl into more than two ranges. A corresponding set of read voltages can be selected based on the range into which Vwl is classified.

The voltage which is compared to Vref can be the full word line voltage Vwl or some fraction of the word line voltage, for example. The voltage detector may be in the peripheral area so that there is an appreciable distance between the word line and the detector, resulting in RC delays. A further issue is that the word line in the floating state may have a smaller capacitance than the conductive path 2173. These issues can be considered in the detection process. For example, a voltage of less than 2 V at the detector may correspond to a voltage of 2 V at the word line. The output of the detector can be taken at a specified time after the word line is connected to the detector via the pass gate 2112.

Generally, it is sufficient to measure the voltage of one word line in a block. It is helpful to avoid using an edge word line (e.g., WLL0 or WLL10) since its voltage may be impacted by edge effects. In some cases, a block may be partially programmed so that some word lines at the bottom of the block, starting with WLL0, are programmed while other, higher word lines are not programmed. The programmed state of the cells should not affect the word line voltage reading significantly.

A first aspect disclosed herein includes a non-volatile storage device comprising non-volatile memory cells arranged as NAND strings, a plurality of word lines coupled to the non-volatile memory cells, and a control circuit. The control circuit is configured to detect a magnitude of an initial voltage on a first word line of the plurality of word lines, and apply a voltage to a second word line of the plurality of word lines during a pre-read phase of a sense operation of selected memory cells on the NAND strings. The voltage has a parameter having a value that depends on the detected magnitude of the initial voltage on the first word line, including control the value of the parameter to reduce peak current consumption when the magnitude of the initial voltage is lower than a pre-determined voltage. The control circuit is configured to sense the selected memory cells after applying the voltage to the second word line, including apply one or more read compare voltages to a selected word line.

In a second aspect in furtherance of the first aspect, the parameter comprises a ramp rate of the voltage to the second word line.

In a third aspect in furtherance of the first or second aspects, the non-volatile storage device further comprises a charge pump configured to deliver the voltage to the second word line during the pre-read phase. Also, the control circuit is further configured to operate the charge pump at a first ramp rate to provide the voltage to the second word line when the magnitude of the initial voltage on the first word line is less than a pre-determined voltage. Also, the control circuit is further configured to operate the charge pump at a second ramp rate to provide the voltage to the second word line when the magnitude of the initial voltage on the first word line is greater than the pre-determined voltage, the second ramp rate is faster than the first ramp rate.

In a fourth aspect in furtherance of any of the first to third aspects, wherein the parameter comprises a number of intermediate voltage levels of the voltage applied to the second word line during the pre-read phase.

In a fifth aspect in furtherance of any of the first to fourth aspects, the control circuit is further configured to cause a first number of intermediate voltage levels of the voltage applied to the second word line during the pre-read phase when the magnitude of the initial voltage on the first word line is greater than a pre-determined voltage. Also, the control circuit is further configured to cause a second number of intermediate voltage levels of the voltage applied to the second word line during the pre-read phase when the magnitude of the initial voltage on the first word line is less than the pre-determined voltage. The second number of intermediate voltage levels is more than the first number of intermediate voltage levels.

In a sixth aspect in furtherance of any of the first to fifth aspects, the parameter comprises a time at which the voltage is first applied to the second word line during the pre-read phase relative to a time that voltages are applied to other word lines of the plurality of word lines during the pre-read phase.

In a seventh aspect in furtherance of the sixth aspect, the control circuit is further configured to start the voltage on the second word line and the voltages to the other word lines at the same time during the pre-read phase when the magnitude of the initial voltage on the first word line is greater than a pre-determined voltage. Also, the control circuit is further configured to start the voltage on the second word line later than voltages at least some of the other word lines during the pre-read phase when the magnitude of the initial voltage on the first word line is less than the pre-determined voltage.

In an eighth aspect in furtherance of any of the first to seventh aspects, the pre-read phase comprises a channel discharge phase of the sense operation in which channels of the NAND strings are discharged.

In a ninth aspect in furtherance of any of the first to eighth aspects, the second word line is the selected word line.

One embodiment disclosed herein includes a method of operating non-volatile storage. The method comprises detecting a magnitude of an initial voltage on a first word line of a plurality of word lines in the non-volatile storage. The method comprises applying a voltage a voltage to a second word line of the plurality of word lines during a discharge phase of a sense operation of selected memory cells on NAND strings. The voltage has a parameter having a value that depends on the detected magnitude of the initial voltage on the first word line. The method comprises selected the value of the parameter to reduce peak current consumption when the magnitude of the initial voltage is lower than a pre-determined voltage. The pre-determined voltage distinguishes between a first read condition and a second read condition. The method comprises sensing the selected memory cells during a sense phase of the sense operation. Sensing the memory cells includes applying one or more read compare voltages to a selected word line.

One embodiment includes a non-volatile storage device comprising non-volatile memory cells arranged as NAND strings, a plurality of word lines coupled to the non-volatile memory cells, and a control circuit. The control circuit is configured to determine whether a first read condition or a second read condition is met with respect to a group of non-volatile memory cells to undergo a sense operation. The control circuit is configured to apply a voltage to a set of word lines of the plurality of word lines during a channel discharge phase of the sense operation. The voltage has a first number of intermediate voltage levels when the first read condition is met. The voltage having a second number of intermediate voltage levels when the second read condition is met. The first number of intermediate voltage levels is greater than the second number of intermediate voltage levels. The control circuit is configured to sense the group of memory cells during a sense phase of the sense operation after the channel discharge phase.

One embodiment includes a method of operating a non-volatile storage device comprising non-volatile memory cells arranged as NAND strings. The method comprises determining whether a first read condition or a second read condition is met with respect to a group of non-volatile memory cells to undergo a sense operation. The method comprises applying a voltage to a set of word lines of the plurality of word lines during a pre-read phase of a sense operation. The pre-read phase may be a channel discharge phase of the sense operation. The voltage has a first number of intermediate voltage levels when the first read condition is met. The voltage has a second number of intermediate voltage levels when the second read condition is met. The first number of intermediate voltage levels is greater than the second number of intermediate voltage levels. The method further comprises sensing the group of memory cells during a sense phase of the sense operation after the pre-read phase.

One embodiment includes a non-volatile storage device comprising a plurality of NAND strings comprising non-volatile storage cells, a plurality of word lines coupled to the NAND strings, and a control circuit. The control circuit is configured to determine whether a first read condition or a second read condition is met prior to a sense operation on selected non-volatile memory cells on the NAND strings. The control circuit is configured to apply voltages to the plurality of word lines prior to the sensing phase of the sense operation. The voltages to the plurality of word lines are started at the same time when the second read condition is met, wherein at least one of the voltages to the plurality of word lines is delayed relative to the other voltages when the first read condition is met. The control circuit is configured to sense the selected non-volatile memory cells during the sensing phase.

One embodiment includes a method of operating non-volatile storage device comprising a plurality of NAND strings comprising non-volatile storage cells. The method comprises determining whether a first read condition or a second read condition is met prior to a pre-read phase of a sense operation on selected non-volatile memory cells on the NAND strings. The method comprises applying voltages to a plurality of word lines during the pre-read phase prior to the sensing phase of the sense operation. The voltages to the plurality of word lines are started at the same time during the pre-read phase when the second read condition is met. At at least one of the voltages to the plurality of word lines is delayed relative to the other voltages during the pre-read phase when the first read condition is met. The method comprises sensing the selected non-volatile memory cells during the sensing phase.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage device comprising:
   non-volatile memory cells arranged as NAND strings;
   a plurality of word lines coupled to the non-volatile memory cells; and
   a control circuit configured to:
   detect a magnitude of an initial voltage on a first word line of the plurality of word lines;
   apply a voltage to a second word line of the plurality of word lines during a pre-read phase of a sense operation of selected memory cells on the NAND strings, the voltage having a parameter having a value that depends on the detected magnitude of the initial voltage on the first word line, including control the value of the parameter to reduce peak current consumption when the magnitude of the initial voltage is lower than a pre-determined voltage; and
   sense the selected memory cells after applying the voltage to the second word line, including apply one or more read compare voltages to a selected word line.

2. The non-volatile storage device of claim 1, wherein the parameter comprises a ramp rate of the voltage to the second word line.

3. The non-volatile storage device of claim 1, wherein:
   the non-volatile storage device further comprises a charge pump configured to deliver the voltage to the second word line during the pre-read phase;

the control circuit is further configured to operate the charge pump at a first ramp rate to provide the voltage to the second word line when the magnitude of the initial voltage on the first word line is less than a pre-determined voltage; and the control circuit is further configured to operate the charge pump at a second ramp rate to provide the voltage to the second word line when the magnitude of the initial voltage on the first word line is greater than the pre-determined voltage, the second ramp rate is faster than the first ramp rate.

4. The non-volatile storage device of claim 1, wherein the parameter comprises a number of intermediate voltage levels of the voltage applied to the second word line during the pre-read phase.

5. The non-volatile storage device of claim 1, wherein the control circuit is further configured to:

cause a first number of intermediate voltage levels of the voltage applied to the second word line during the pre-read phase when the magnitude of the initial voltage on the first word line is greater than a pre-determined voltage; and cause a second number of intermediate voltage levels of the voltage applied to the second word line during the pre-read phase when the magnitude of the initial voltage on the first word line is less than the pre-determined voltage, the second number of intermediate voltage levels is more than the first number of intermediate voltage levels.

6. The non-volatile storage device of claim 1, wherein the parameter comprises a time at which the voltage is first applied to the second word line during the pre-read phase relative to a time that voltages are applied to other word lines of the plurality of word lines during the pre-read phase.

7. The non-volatile storage device of claim 6, wherein the control circuit is further configured to:

start the voltage on the second word line and the voltages to the other word lines at the same time during the pre-read phase when the magnitude of the initial voltage on the first word line is greater than a pre-determined voltage; and start the voltage on the second word line later than voltages at least some of the other word lines during the pre-read phase when the magnitude of the initial voltage on the first word line is less than the pre-determined voltage.

8. The non-volatile storage device of claim 1, wherein the pre-read phase comprises a channel discharge phase of the sense operation in which channels of the NAND strings are discharged.

9. The non-volatile storage device of claim 1, wherein the second word line is the selected word line.

10. A non-volatile storage device comprising:
non-volatile memory cells arranged as NAND strings;
a plurality of word lines coupled to the non-volatile memory cells; and
a control circuit configured to:
determine whether a first read condition or a second read condition is met with respect to a group of non-volatile memory cells to undergo a sense operation;
apply a voltage to a set of word lines of the plurality of word lines during a channel discharge phase of the sense operation, the voltage having a first number of intermediate voltage levels when the first read condition is met, the voltage having a second number of intermediate voltage levels when the second read condition is met, the first number of intermediate voltage levels is greater than the second number of intermediate voltage levels; and
sense the group of memory cells during a sense phase of the sense operation after the channel discharge phase.

11. The non-volatile storage device of claim 10, wherein the control circuit is further configured to:
select the first number of intermediate voltage levels to reduce peak current consumption when the first read condition is met.

12. The non-volatile storage device of claim 10, wherein the control circuit is further configured to:
determine whether the first read condition or the second read condition is met based on an amount of time since the last sense operation of any of the non-volatile memory cells coupled to the plurality of word lines.

13. The non-volatile storage device of claim 10, wherein the control circuit is further configured to:
determine whether the first read condition or the second read condition is met based on a magnitude of an initial voltage on a first word line of the plurality of word lines at a time of the channel discharge phase.

14. The non-volatile storage device of claim 13, wherein the control circuit is further configured to:
establish the voltage to the set of word lines having the second number of intermediate voltage levels when the initial voltage on the first word line is greater than a pre-determined voltage; and
establish the voltage to the set of word lines having the first number of intermediate voltage levels when the initial voltage on the first word line is less than the pre-determined voltage.

15. A non-volatile storage device comprising:
a plurality of NAND strings comprising non-volatile storage cells;
a plurality of word lines coupled to the NAND strings; and
a control circuit configured to:
determine whether a first read condition or a second read condition is met prior to a sense operation on selected non-volatile memory cells on the NAND strings;
apply voltages to the plurality of word lines prior to a sensing phase of the sense operation, wherein the voltages to the plurality of word lines are started at the same time when the second read condition is met, wherein at least one of the voltages to the plurality of word lines is delayed relative to the other voltages when the first read condition is met; and
sense the selected non-volatile memory cells during the sensing phase.

16. The non-volatile storage device of claim 15, wherein the control circuit is configured to apply the voltages to the plurality of word lines during a channel discharge phase of the sense operation.

17. The non-volatile storage device of claim 15, wherein the control circuit is further configured to:
select a number of word lines for which the voltage is delayed in order to reduce peak current consumption when the first read condition is met.

18. The non-volatile storage device of claim 15, wherein the control circuit is further configured to:
determine whether the first read condition or the second read condition is met based on an amount of time since the last sense operation of a memory cell on any of the NAND strings.

19. The non-volatile storage device of claim 15, wherein the control circuit is further configured to:
  determine whether the first read condition or the second read condition is met based on a magnitude of an initial voltage on a first word line of the plurality of word lines prior to the sensing phase.

20. The non-volatile storage device of claim 19, wherein the control circuit is further configured to:
  start all of the voltages applied to the plurality of word lines at the same time when the initial voltage on the first word line is greater than a pre-determined voltage; and
  delay the voltage applied to at least one of the word lines relative to the voltages applied to remaining word lines when the initial voltage on the first word line is less than the pre-determined voltage.

* * * * *